(12) United States Patent
Ikeda

(10) Patent No.: US 7,600,205 B2
(45) Date of Patent: Oct. 6, 2009

(54) NET/WIRING SELECTION METHOD, NET SELECTION METHOD, WIRING SELECTION METHOD, AND DELAY IMPROVEMENT METHOD

(75) Inventor: Hiroshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 366 days.

(21) Appl. No.: 11/637,728

(22) Filed: Dec. 13, 2006

(65) Prior Publication Data
US 2007/0089081 A1   Apr. 19, 2007

Related U.S. Application Data

(62) Division of application No. 10/972,660, filed on Oct. 26, 2004, now Pat. No. 7,191,420.

(30) Foreign Application Priority Data
Jun. 7, 2004 (JP) .............................. 2004-168969

(51) Int. Cl.
G06F 17/50 (2006.01)
(52) U.S. Cl. ................. 716/6; 716/10; 716/11
(58) Field of Classification Search ................. 716/5–6, 716/10–14
See application file for complete search history.

(56) References Cited

U.S. PATENT DOCUMENTS 5,892,685 A    4/1999  Sugiyama et al. ........... 364/490
6,110,222 A    8/2000  Minami et al. ................... 716/9
6,530,066 B1   3/2003  Ito et al.
7,191,420 B2   3/2007  Ikeda
2003/0217344 A1  11/2003  Ito et al. .......................... 716/6
2004/0216067 A1* 10/2004  Tanaka et al. .................. 716/10
2007/0143723 A1*  6/2007  Kawakami ...................... 716/6

FOREIGN PATENT DOCUMENTS

JP          7-93386          4/1995

(Continued)

OTHER PUBLICATIONS

Japanese Office Notice of Grounds of Rejection mailed Oct. 28, 2008 for corresponding Japanese Patent Application No. 2004-168969.

(Continued)

*Primary Examiner*—Paul Dinh
(74) *Attorney, Agent, or Firm*—Staas & Halsey, LLP

(57) ABSTRACT

The present invention relates to a net/wiring selection method for selecting, from among nets/wirings wired on the basis of layout information, a net/wiring whose layout is to be changed with priority in order to improve a delay. To enable efficient elimination of a critical path, the method is arranged to include a wiring capacitance lower limit computation step for computing wiring capacitance lower limits on the basis of layout information; an inter-wiring capacitance computation step for computing, as an inter-wiring capacitance, a difference between a real wiring capacitance and the wiring capacitance lower limit; a parallel wiring length extraction step for extracting a parallel wiring length existing between adjacent wirings of the respective wirings; and a selection step for selecting a net/wiring whose layout is to be changed, on the basis of the inter-wiring capacitance, the parallel wiring length, and a slack value.

4 Claims, 19 Drawing Sheets

FOREIGN PATENT DOCUMENTS

| | | |
|---|---|---|
| JP | 7-263559 | 10/1995 |
| JP | 10-313058 | 11/1998 |
| JP | 2000-357744 | 12/2000 |
| JP | 2001-93982 | 4/2001 |
| JP | 2002-280454 | 9/2002 |
| JP | 2002-313921 | 10/2002 |
| JP | 2003-58594 | 2/2003 |
| WO | WO 2004/046975 | 6/2004 |

OTHER PUBLICATIONS

U.S. Appl. No. 11/637,731, filed Dec. 13, 2006, Hiroshi Ikeda, Fujitsu Limited.

* cited by examiner

NET/WIRING SELECTION METHOD, NET SELECTION METHOD, WIRING SELECTION METHOD, AND DELAY IMPROVEMENT METHOD

CROSS REFERENCE TO RELATED APPLICATION

This application is a divisional of application Ser. No. 10/972,660, filed Oct. 26, 2004 now U.S. Pat. No. 7,191,420, which is incorporated herein by reference.

BACKGROUND OF THE INVENTION

1) Field of the Invention

The present invention relates to a technique for selecting a net/wiring whose layout is to be changed for improving a delay in connection with a technique for designing a semiconductor device; particularly, a large-scale integrated circuit (LSI), as well as to a technique for selecting a net/wiring whose layout is to be changed for improving a delay and changing the layout of the thus-selected net/wiring.

2) Description of the Related Art

Various techniques for arranging or wiring a net or a wiring in an optimum state have hitherto been proposed in connection with a technique for designing a semiconductor device (see Patent Documents 1 and 2 provided below).

For instance, Patent Document 1 discloses a technique for making an attempt to reduce the power consumed by circuitry by means of optimizing a wiring width on the basis of a slack value. Patent Document 2 discloses a technique for designing a package on the basis of a delay value for improving a delay.

However, a wiring delay has recently increased in comparison with a gate delay, as a result of miniaturization of a semiconductor device; particularly, a large-scale integrated circuit (LSI). Of the wiring capacitances that are prime causes of a wiring delay, a wiring capacitance [hereinafter called an inter-wiring capacitance (Δc)] existing between a wiring and another wiring adjacent thereto is higher than a wiring capacitance existing between a wiring and a substrate.

Therefore, even when at the time of designing of a miniaturized LSI an attempt is made to solve a wiring delay on the basis of a mere delay value, as described in Patent Document 2, difficulty is encountered in reliably improving a wiring delay. Further, it is desirable to change the layout of a net/wiring having a large inter-wiring capacitance (Δc) such that the inter-wiring capacitance is curtailed.

In connection with designing of a semiconductor integrated circuit, there has been proposed a technique for changing the layout of a wiring, in consideration of the inter-wiring capacitance for improving a delay (see Patent Documents 3 and 4 provided below).

[Patent Document 1] Japanese Patent Application Laid-Open No. HEI 7-93386

[Patent Document 2] Japanese Patent Application Laid-Open No. HEI 7-263559

[Patent Document 3] Japanese Patent Application Laid-Open No. HEI 10-313058

[Patent Document 4] Japanese Patent Application Laid-Open No. 2002-280454

However, according to the technique that is described in Patent Documents 3 and 4 and that uses inter-wiring capacitances registered in a table before hand while taking lengths of adjacent wirings and cross rates as parameters, an inter-wiring capacitance cannot be determined with high accuracy. As a result, a wiring whose delay should be improved cannot be selected reliably or efficiently.

SUMMARY OF THE INVENTION

The present invention has been conceived in light of the problem set forth and is intended for reliably selecting a net/wiring whose layout is to be changed with priority for improving a delay and for efficiently solving a critical path.

To achieve the object, a net/wiring selection method of the present invention relates to a net/wiring selection method for selecting, from among nets/wirings wired on the basis of layout information, a net/wiring whose layout is to be changed with priority in order to improve a delay, the method comprising: a wiring capacitance lower limit computation step for computing wiring capacitance lower limits of respective wirings on the basis of the layout information; an inter-wiring capacitance computation step for computing, as an inter-wiring capacitance, a difference between a real wiring capacitance and the wiring capacitance lower limit computed in the wiring capacitance lower limit computation step; a parallel wiring length extraction step for extracting a parallel wiring length existing between adjacent wirings of the respective wirings, on the basis of the layout information; and a selection step for selecting a net/wiring whose layout is to be changed, on the basis of the inter-wiring capacitance computed in the inter-wiring capacitance computation step, the parallel wiring length extracted in the parallel wiring extraction step, and a slack value.

To achieve the object, a net/wiring selection apparatus of the present invention relates to a net/wiring selection apparatus for selecting, from among nets/wirings wired on the basis of layout information, a net/wiring whose layout is to be changed with priority in order to improve a delay, the apparatus comprising: a wiring capacitance lower limit computation section for computing wiring capacitance lower limits of respective wirings on the basis of the layout information; an inter-wiring capacitance computation section for computing, as an inter-wiring capacitance, a difference between a real wiring capacitance and the wiring capacitance lower limit computed by the wiring capacitance lower limit computation section; a parallel wiring length extraction section for extracting a parallel wiring length existing between adjacent wirings of the respective wirings; and a selection section for selecting a net/wiring whose layout is to be changed, on the basis of the inter-wiring capacitance computed by the inter-wiring capacitance computation section, the parallel wiring length extracted by the parallel wiring extraction section, and a slack value.

Moreover, in order to achieve the object, a net/wiring selection program of the present invention relates to a net/wiring selection program for causing a computer to perform a function of selecting, from among nets/wirings wired on the basis of layout information, a net/wiring whose layout is to be changed with priority in order to improve a delay on the basis of layout information, the program causing the computer to act as: a wiring capacitance lower limit computation section for computing wiring capacitance lower limits of respective wirings on the basis of the layout information; an inter-wiring capacitance computation section for computing, as an inter-wiring capacitance, a difference between a real wiring capacitance and the wiring capacitance lower limit computed by the wiring capacitance lower limit computation section; a parallel wiring length extraction section for extracting a parallel wiring length existing between adjacent wirings of the respective wirings; and a selection section for selecting a net/wiring whose layout is to be changed, on the basis of the inter-wiring capacitance computed by the inter-wiring capacitance computation section, the parallel wiring length extracted by the parallel wiring extraction section, and a slack value.

In order to achieve the object, the computer-readable recording medium of the present invention records the net/wiring selection program.

In order to achieve the object, a delay-improvement method of the present invention relates to a delay improvement method comprising: a wiring capacitance lower limit computation step for computing, on the basis of layout information, wiring capacitance lower limits of respective wirings wired on the basis of the layout information; an inter-wiring capacitance computation step for computing, as an inter-wiring capacitance, a difference between a real wiring capacitance and the wiring capacitance lower limit computed in the wiring capacitance lower limit computation step; a parallel wiring length extraction step for extracting a parallel wiring length existing between adjacent wirings of the respective wirings, on the basis of the layout information; a selection step for selecting a net/wiring whose layout is to be changed, on the basis of the inter-wiring capacitance computed in the inter-wiring capacitance computation step, the parallel wiring length extracted in the parallel wiring extraction step, and a slack value; and a layout change step for changing a layout of the net/wiring selected in the selection step.

As mentioned above, according to the present invention, a net/wiring is selected on the basis of an inter-wiring capacitance, the length of a parallel wiring, and a slack value. Therefore, a net/wiring whose layout is to be changed with priority for improving a delay can be selected without fail. Moreover, the net/wiring is selected on the basis of the length of the parallel wiring. Accordingly, a net/wiring which is likely to improve a delay in a critical path when a layout of the net/wiring is changed can be efficiently selected.

Moreover, according to the present invention, a change is made in the layout of the net/wiring that is selected on the basis of an inter-wiring capacitance, the length of a parallel wiring, and a slack value. Hence, a delay in a critical path can be improved without fail and efficiently. First, a net whose layout is to be changed with priority is narrowed down, and then, from the specified net, a wiring whose layout is to be changed is specified. Therefore, the layout of the entire LSI can be changed in a well-balanced manner for improving a delay.

DESCRIPTION OF THE PREFERRED EMBODIMENTS

Embodiments of the present invention will be described hereinbelow by reference to the drawings.

[1] Descriptions of terms employed in the present invention

Figure 1:
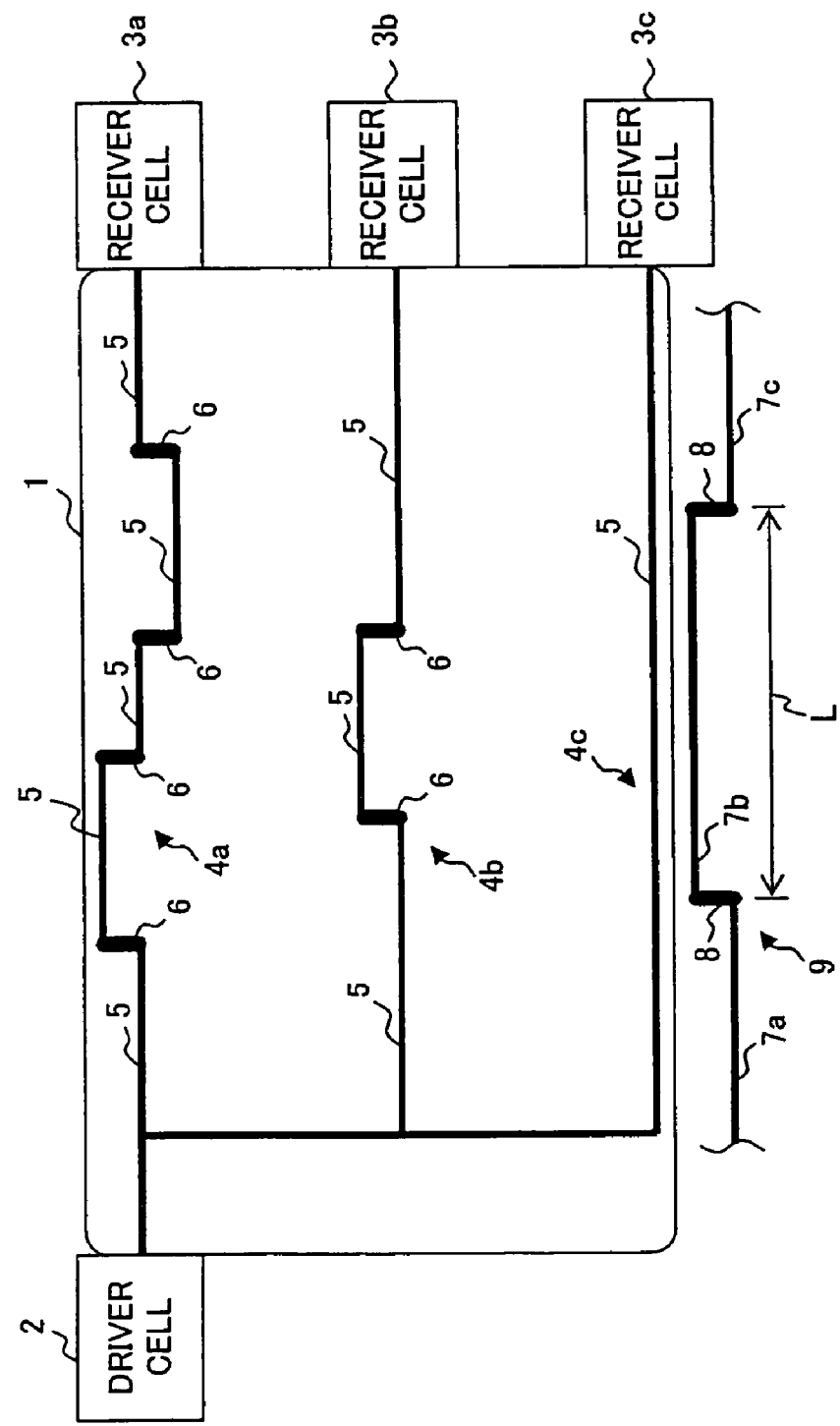
FIG. 1 is a diagrammatic view showing a portion of a semiconductor integrated circuit for describing a relationship between a net and a wiring according to the present invention.

A Net, a Wiring, and a Parallel Wiring, Which are Employed in the Present Invention First, a relationship between a net and a wiring and the length of a parallel wiring will be described in relation to the terms of the present invention. FIG. 1 is a diagrammatic view showing a portion of a semiconductor integrated circuit for describing a relationship between a net and a wiring according to the present invention.

The term "wiring" employed herein signifies a wire or a via for connecting one driver cell constituting a semiconductor integrated circuit [e.g., a large-scale integrated circuit (LSI)] to one receiver cell which is activated by the driver cell. In the embodiment shown in FIG. 1, wires 5 and vias 6, which connect a driver cell 2 to a receiver cell 3a, constitute a single wiring 4a. Moreover, wires 5 and vias 6, which connect the driver cell 2 to a receiver cell 3b, constitute a single wiring 4b. The wire 5 connecting the driver cell 2 to a receiver cell 3c constitutes a single wiring 4c.

The term "net" employed herein signifies a collection of wirings which connect one driver cell to receiver cells to be activated by the driver cell. In the embodiment shown in FIG. 1, a collection of wirings 4a to 4c which connect the driver cell 2 to receiver cells 3a to 3c constitutes a net 1.

Moreover, the term "parallel wiring length" employed herein signifies the length of any of wirings—which are adjacent to a certain wiring and wired in parallel to the same—, wherein the wiring runs closest to the certain wiring. For instance, as shown in FIG. 1, when a wiring 9 consisting of wires 7a to 7c and vias 8 is wired adjacent to the wiring 4c, the length L of the wire 7b which is a part of the wiring 9 and is closest to and parallel to the single wiring 4c becomes a parallel wiring length of the wiring 4c, wherein the wiring 9 runs consecutively in parallel to the wiring 4c.

[2] First Embodiment

Figure 2:
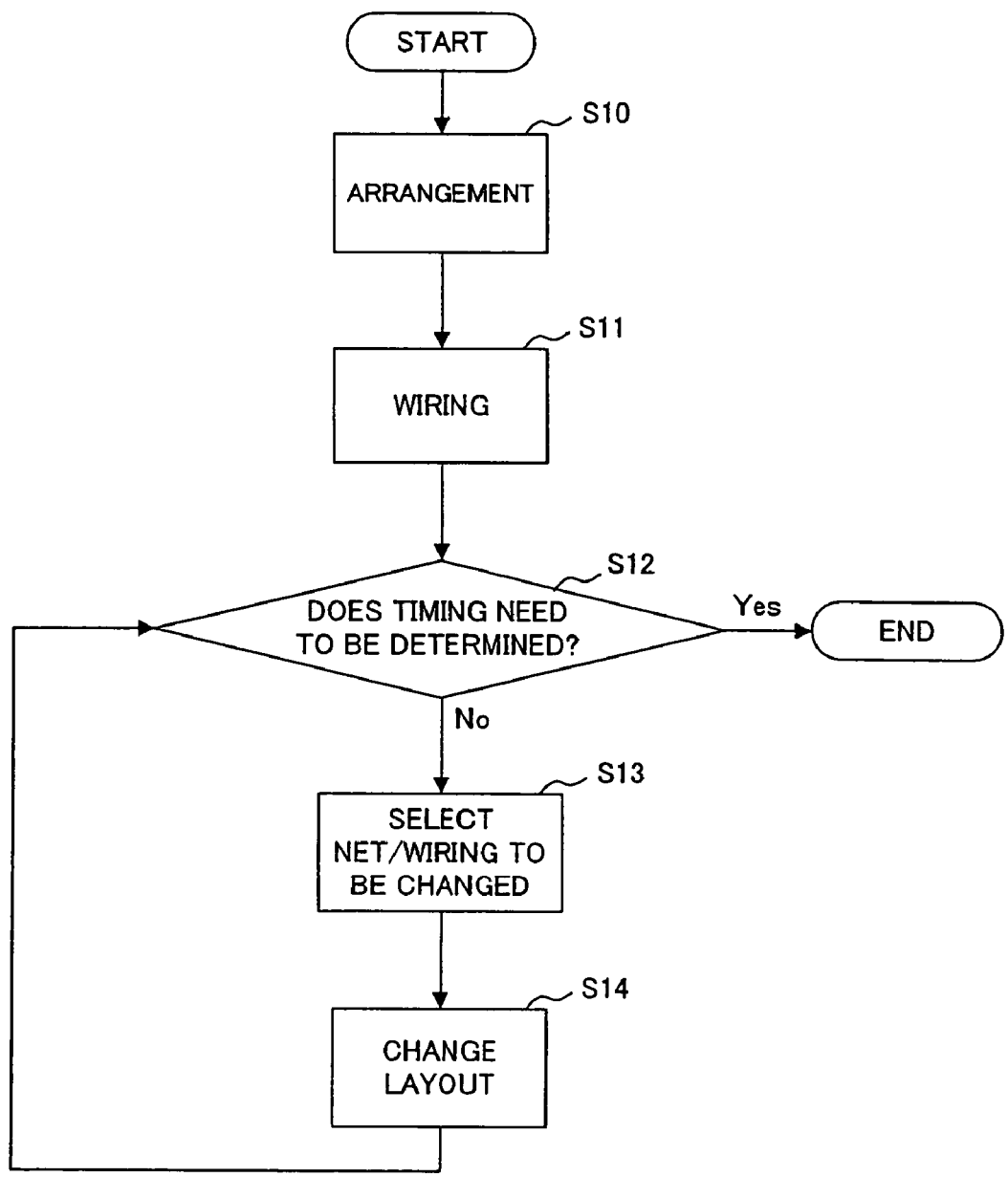
FIG. 2 is a flowchart for describing procedures for designing a semiconductor integrated circuit to which are applied a net/wiring selection apparatus and method of the present invention and a delay improvement apparatus and method of the present invention.

The delay improvement apparatus and method employed as the first embodiment of the present invention will now be described. FIG. 2 is a flowchart (steps S10 to S14) for describing procedures for designing a semiconductor integrated circuit to which are applied a net/wiring selection apparatus and method of the present invention and a delay improvement apparatus and method of the present invention. As shown in FIG. 2, in the case of designing of a semiconductor integrated circuit (hereinafter called an LSI), respective elements (driver cells, receiver cells, or the like) constituting the LSI are arranged after logical synthesis has been effected on the basis of design data including layout information (step S10), and wires are wired between the elements (step S11). Subsequently, a timing determination is made as to whether or not transfer is performed within a target cycle (step S12). During the timing determination pertaining to step S12, capacitances and slack values of wirings wired on the basis of the layout information and slack values of nets are also computed.

When the timing determination (step S12) determines that transfer is carried out within the target cycle (when YES is selected in step S12), processing is terminated. When a determination is made that transfer is not carried out within the target cycle (when NO is selected in step S12), a net/wiring whose layout is to be changed for improving a wiring delay is selected (step S13), and the layout of the thus-selected net/wiring is changed (step S14). Moreover, the timing determination (step S12) is again performed after the layout has been changed; processing pertaining to steps S12 to S14 is iterated until YES is selected in step S12.

The delay improvement apparatus and method of the embodiment are applied to steps S13 and S14 in FIG. 2. Delay improvement apparatus and methods which serve as second and third embodiments to be described are also applied to steps S13 and S14 in FIG. 2. The net/wiring selection apparatus and method of the present invention are applied to step S13 in FIG. 2.

Figure 3:
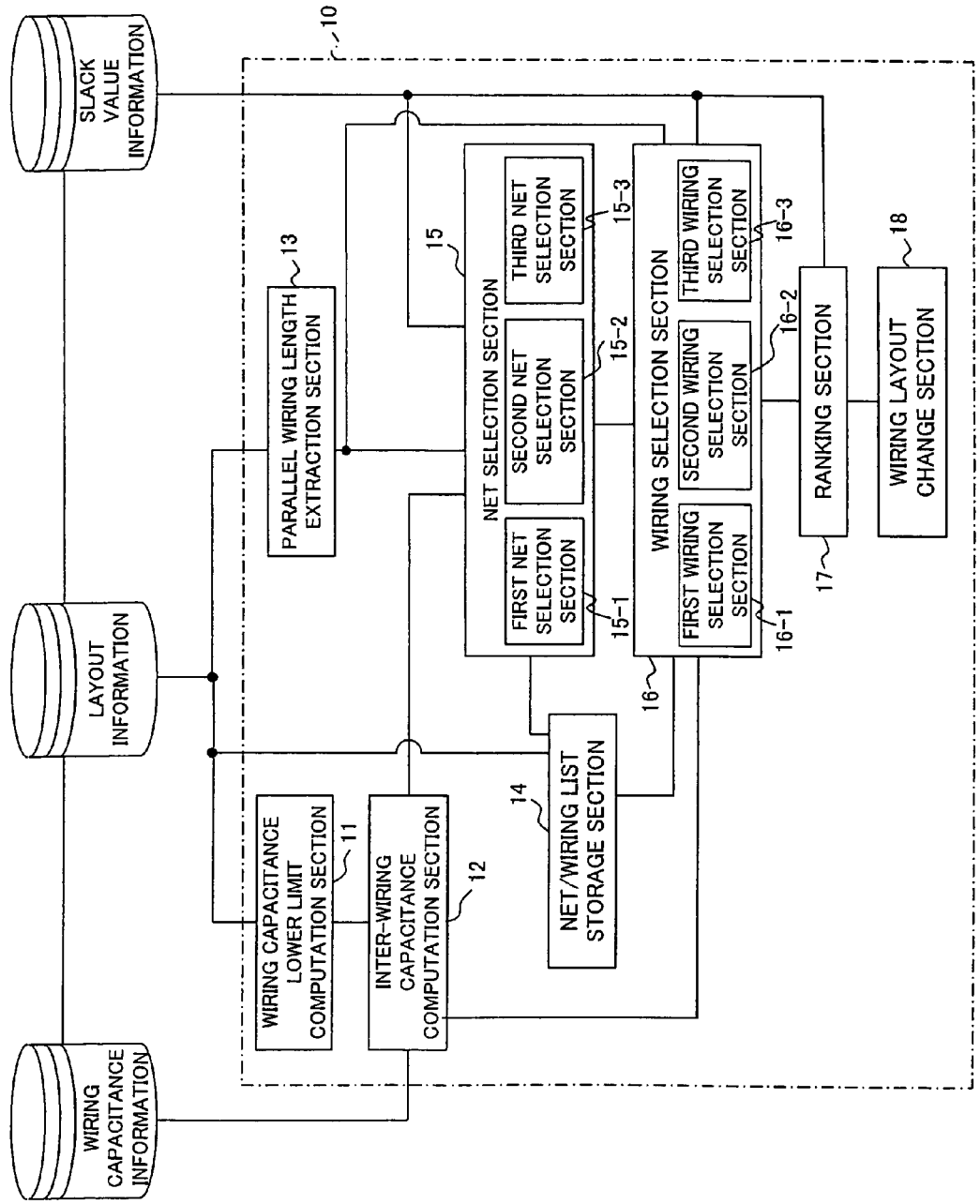
FIG. 3 is a block diagram showing the configuration of a delay improvement apparatus serving as a first embodiment of the present invention.

FIG. 3 is a block diagram showing the configuration of a delay improvement apparatus serving as a first embodiment of the present invention. As shown in FIG. 3, the delay improvement apparatus 10 of the embodiment comprises a wiring capacitance lower limit computation section 11, an inter-wiring capacitance computation section 12, a parallel wiring length extraction section 13, a net/wiring list storage section 14, a net selection section 15, a wiring selection section 16, a ranking section 17, and a wiring layout change section 18.

The wiring capacitance lower limit computation section 11 is for computing wiring capacitance lower limits of respective wirings wired on the basis of the layout information serving as design data pertaining to an LSI. In the embodiment, the wiring capacitance lower limit computation section 11 computes, as a wiring capacitance lower limit, the wiring capacitance of the target wiring achieved on condition that all wirings adjacent to the target wiring have been removed. As shown in, e.g., FIG. 4, in reality, even when wirings 7d, 7e, and 7f are adjacent to surroundings of the target wiring 4 wired on the substrate, the wiring capacitance lower limit computation section 11 computes, as a wiring capacitance lower limit, the wiring capacitance of the target wiring 4 achieved on condition that the wirings 7d to 7f adjacent to the target wiring 4 have been virtually removed, as shown in FIG. 5. The wiring capacitance lower limit computed by the wiring capacitance lower limit computation section 11 becomes equal to the wiring capacitance developing between the substrate and the target wiring.

The inter-wiring capacitance computation section 12 computes, as an inter-wiring capacitance ($\Delta c$), a difference between a real wiring capacitance computed on the basis of the layout information through the timing determination (step S12) in FIG. 2 and the wiring capacitance lower limited computed by the wiring capacitance lower limit computation section 11. The term "real wiring capacitance" means a real wiring capacitance achieved in steps S10 and S11 shown in FIG. 2 while the wirings are provided on the basis of the layout information, or a real wiring capacitance achieved after the layout has been changed in step S14 in FIG. 2.

The parallel wiring length extraction section 13 is for extracting the length of a wiring parallel to an adjacent wiring (hereinafter called a "parallel wiring length") on the basis of the layout information.

The net/wiring list storage section 14 is for storing selectable nets and wirings. The net/wiring list based on the layout information (see a list L1 shown in FIG. 7), a net/wiring list (see lists L2 and L3 shown in FIG. 7) selected by the net selection section 15 to be described later, and a wiring list (see a list L4 shown in FIG. 7) selected by the wiring selection section 16 to be described later are retained by the net/wiring list storage section 14.

The net selection section 15 selects a net whose layout is to be changed from the net/wiring list (see the list L1 shown in FIG. 7) based on the layout information retained in the net/wiring list storage section 14, on the basis of the inter-wiring capacitance computed by the inter-wiring capacitance computation section 12, the parallel wiring length extracted by the parallel wiring length extraction section 13, and the slack value computed on the basis of the layout information through the timing determination (step S12) shown in FIG. 2. In the embodiment, the net selection section 15 is configured as having a first net selection section 15-1, a second net selection section 15-2, and a third net selection section 15-3.

The first net selection section 15-1 selects, as nets whose layouts are to be changed, nets whose slack values computed on the basis of the layout information fall below a predetermined value.

The second net selection section 15-2 selects, as nets whose layouts are to be changed, wherein a total ($\Delta c\_total$) of inter-wiring capacitances ($\Delta c$) of all wirings belonging to each of the nets as computed by the inter-wiring computation section 12 is greater than or equal to a predetermined level.

The third net selection section 15-3 selects, as nets whose layouts are to be changed, nets each having a wiring whose parallel wiring length extracted by the parallel wiring length extraction section 13 is greater than or equal to a predetermined value.

The wiring selection section 16 selects, as wiring whose layout is to be changed, from the wirings belonging to each of the nets selected by the net selection section 15 retained by the net/wiring list storage section 14, on the basis of the inter-wiring capacitance computed by the inter-wiring capacitance computation section 12, the parallel wiring length extracted by the parallel wiring length extraction section 13, and the slack value computed on the basis of the layout information by means of the timing determination (step S12) in FIG. 2. In the embodiment, the wiring selection section 16 is formed from a first wiring selection section 16-1, a second wiring selection section 16-2, and a third wiring selection section 16-3.

The first wiring selection section 16-1 selects, as wirings whose layouts are to be changed, wirings whose slack values computed on the basis of the layout information are less than the predetermined value.

The second wiring selection section 16-2 selects, as wirings whose layouts are to be changed, wirings whose inter-wiring capacitances ($\Delta c$) computed by the inter-wiring capacitance computation section 12 are greater than or equal to the predetermined value.

The third wiring selection section 16-3 selects, as wirings whose layouts are to be changed, wirings whose parallel wiring lengths extracted by the parallel wiring length extraction section 13 are greater than or equal to the predetermined value.

When the wiring selection section 16 has selected two or more wirings, the ranking section 17 ranks the two or more wirings on the basis of the slack values, in such a manner that wirings with smaller slack values are given higher priority orders in layout changing.

The wiring layout change section 18 changes layouts in accordance with the sequence determined by the ranking section 17 such that inter-wiring capacitances among a predetermined number of wirings are reduced; namely, such that an interval between the wiring and another adjacent wiring running parallel thereto is broadened.

Figure 6:
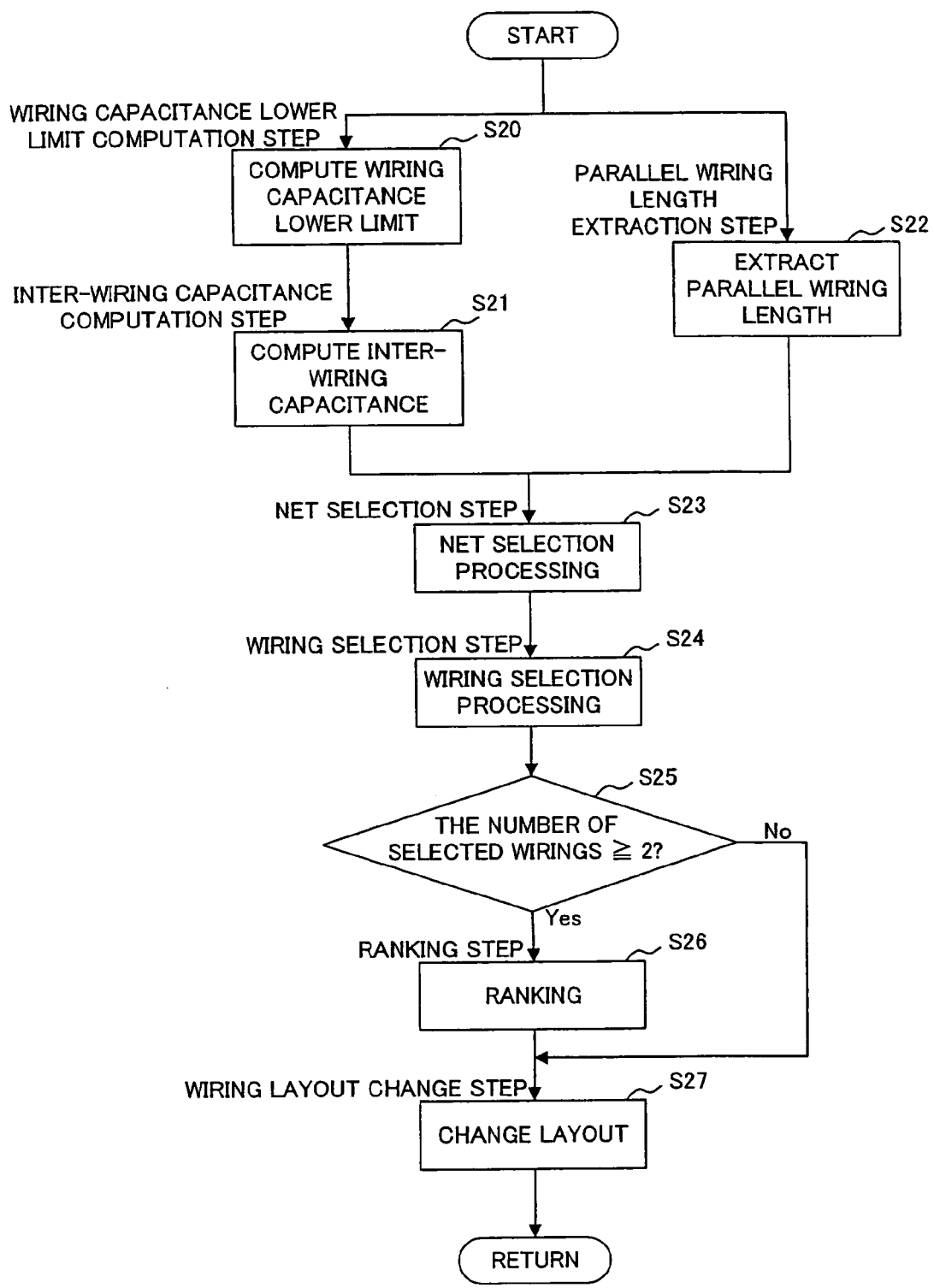
FIG. 6 is a flowchart for describing procedures of the delay improvement method serving as the first embodiment of the present invention.

FIG. 6 is a flowchart showing procedures of the delay improvement method serving as the first embodiment of the present invention (steps S20 to S27). As shown in FIG. 6, in the wiring capacitance lower limit computation step S20, the wiring capacitance lower limit computation section 11 computes the wiring capacitance lower limit of each of the respective wirings on the basis of the layout information. In the inter-wiring capacitance computation step S21, the inter-wiring capacitance computation section 12 computes the inter-wiring capacitance for each of the respective wirings, by means of subtracting the wiring capacitance lower limit computed in the wiring capacitance lower limit computation step S20 from the real inter-wiring capacitance.

In the parallel wiring length extraction step S22, the parallel wiring length extraction section 13 computes parallel wiring length of each of the respective wirings on the basis of the layout information.

Processing pertaining to the inter-wiring capacitance computation step S21 and processing pertaining to the parallel wiring length extraction step S22 may be performed simultaneously, or either one of them may be performed first.

After completion of processing pertaining to the inter-wiring capacitance computation step S21 and processing pertaining to the parallel wiring length extraction step S22, the net selection section 15, in the net selection step S23, selects a net whose layout is to be changed, on the basis of the slack value determined from the layout information, the inter-wiring capacitance computed in the inter-wiring capacitance computation step S21, and the parallel wiring length extracted in the parallel wiring length extraction step S22. The net selection method employed in the net selection step S23 will be described in detail by reference to FIGS. 7 and 8.

In the wiring selection step S24, the wiring selection section 16 selects one or more wirings whose layouts are to be changed from the wirings belonging to the net selected in the net selection step S23, on the basis of the slack values, the inter-wiring capacitances computed in the inter-wiring capacitance extraction step S21, and the parallel wiring lengths extracted in the parallel wiring length extraction step S22. The wiring selection method employed in the wiring selection step S24 will be described later in detail by reference to FIGS. 7 and 9.

If two or more wirings are selected in the wiring selection step S24 (when YES is selected in step S25), the ranking section 17 ranks the plurality of wirings selected in the wiring selection step S24 on the basis of the slack values.

In contrast, if less than two wirings are selected in the wiring selection step S24 (when NO is selected in step S25), processing pertaining to the ranking step S26 is skipped.

In the wiring layout change step S27, the wiring layout change section 18 changes the layout such that an interval between the wiring and another adjacent wiring running in parallel to it is broadened, in order to diminish the inter-wiring capacitance between the wirings selected in the wiring selection step S24 (i.e., to improve a delay in the wirings).

Figure 7:
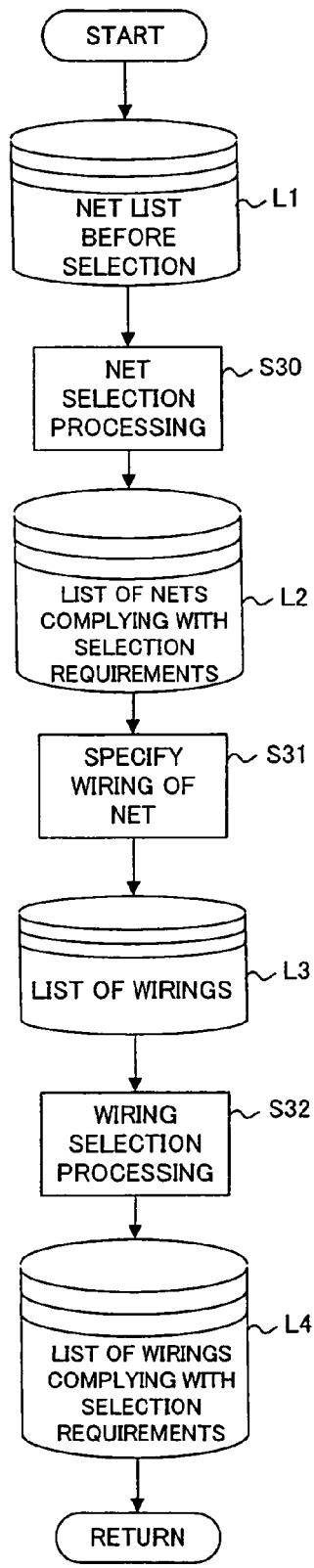
FIG. 7 is a flowchart for describing procedures of a net selection step and those of a wiring selection step in the delay improvement method serving as the first embodiment of the present invention.

Now, operation pertaining to the net selection step S23 and operation pertaining to the wiring selection step S24 will be described in more detail. FIG. 7 shows a flowchart (steps S30 to S32) for describing operation pertaining to the net selection step S23 and operation pertaining to the wiring selection step S24 in the delay improvement method of the embodiment. As shown in FIG. 7, the net selection section 15 selects one or more nets whose layout are to be changed, from the net/wiring list L1 which has been acquired before selection and is based on the layout information retained in the net/wiring list storage section 14; that is, all of the net/wiring lists (step S30).

Figure 8:
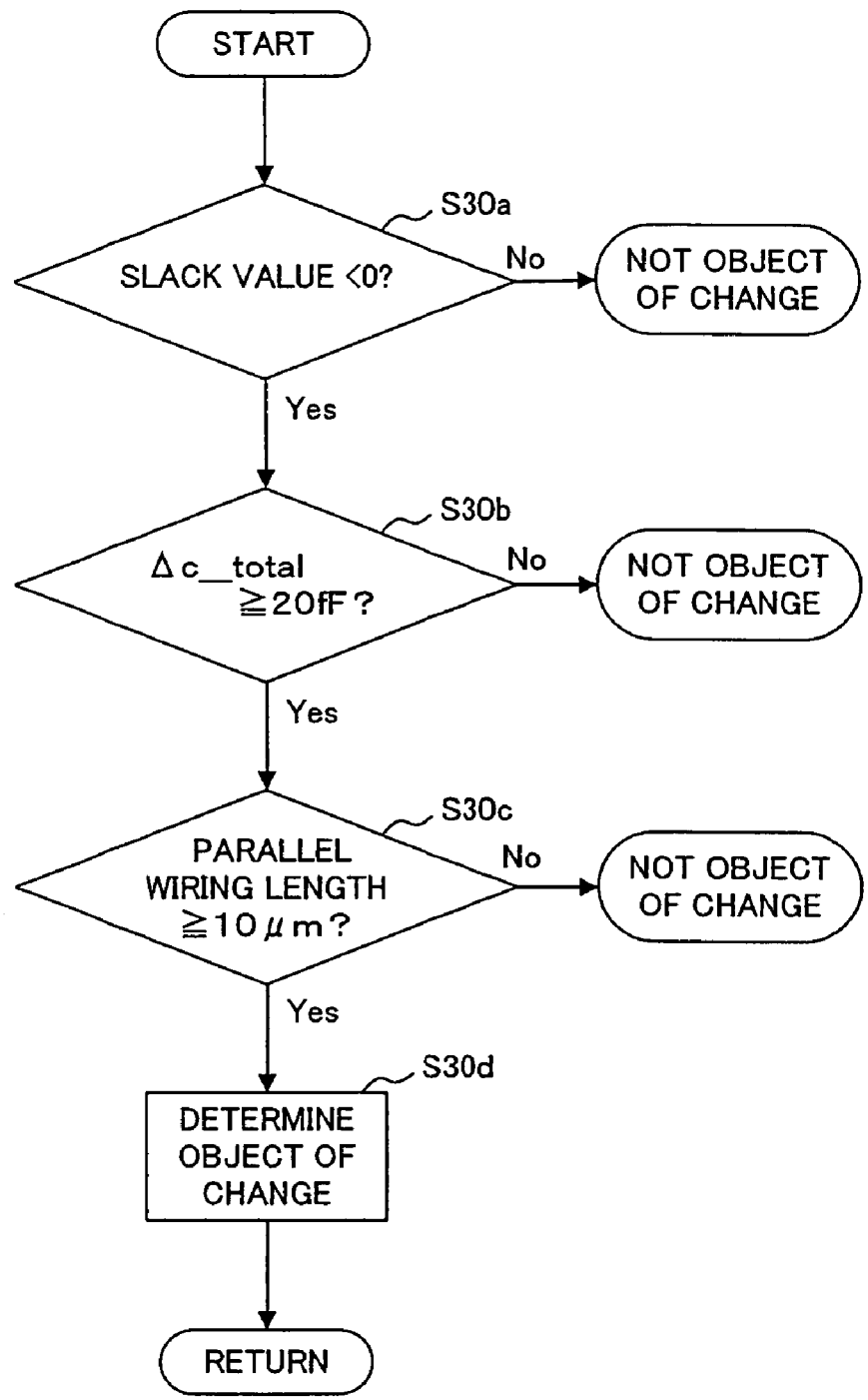
FIG. 8 is a flowchart for describing procedures of the net selection step in the delay improvement method serving as the first embodiment of the present invention.

FIG. 8 is a flowchart (steps S30a to S30d) showing procedures of the net selection step S23 (step S30 shown in FIG. 7) in the delay improvement method of the embodiment. As shown in FIG. 8, in relation to the net selection step S23 (i.e., in step S30 in FIG. 7), the first net selection section 15-1 of the net selection section 15 selects, as nets whose layouts are to be changed, nets from the net list L in a first net selection step S30a, wherein slack values of the respective nets determined on the basis of the layout information are less than a predetermined value (less than 0 in the embodiment).

In a second net selection step S30b, the second net selection section 15-2 selects, as nets whose layouts are to be changed, nets selected in the first net selection step 15-1, wherein a total ($\Delta c\_total$) of inter-wiring capacitances ($\Delta c$) of all wirings belonging to the net is greater than or equal to a predetermined level (e.g., 20 fF or more).

In the third net selection step S30c, the third net selection section 15-3 selects, as nets whose layouts are to be changed, nets each having wirings whose parallel wiring lengths are equal to or greater than a predetermined value (10 μm or more) from the nets selected in the second net selection step S30b, whereby selection of a net whose layout is to be changed by the net selection section 15 is determined (step S30d).

In the embodiment, the net selected in the net selection step S23 is the net selected by all of the first net selection section 15-1 through the third net selection section 15-3. Therefore, in the present invention, no limitations are imposed on the sequence in which processing pertaining to the first net selection step S30a to that pertaining to the third net selection step S30c are to be performed.

As shown in FIG. 7, when the net has been selected by the net selection section 15 (in step S30), the net/wiring list storage section 14 retains the list L2 of the nets selected by the net selection section 15. Moreover, the wirings belonging to each of the nets included in the net list L2 are specified (step S31), and a list L3 of the specified wirings is retained in the net/wiring list storage section 14. The lists L1, L2, L3, a list L4 to be described later, and processing pertaining to step S31 are prepared and performed by means of a computing section (omitted from the drawings) of the delay improvement device 10 formed from, e.g., a CPU (Central Processing Unit).

Next, the wiring selection section 16 selects a wiring whose layout is to be changed from the list L3 retained in the net/wiring list storage section 14 (step S32).

Figure 9:
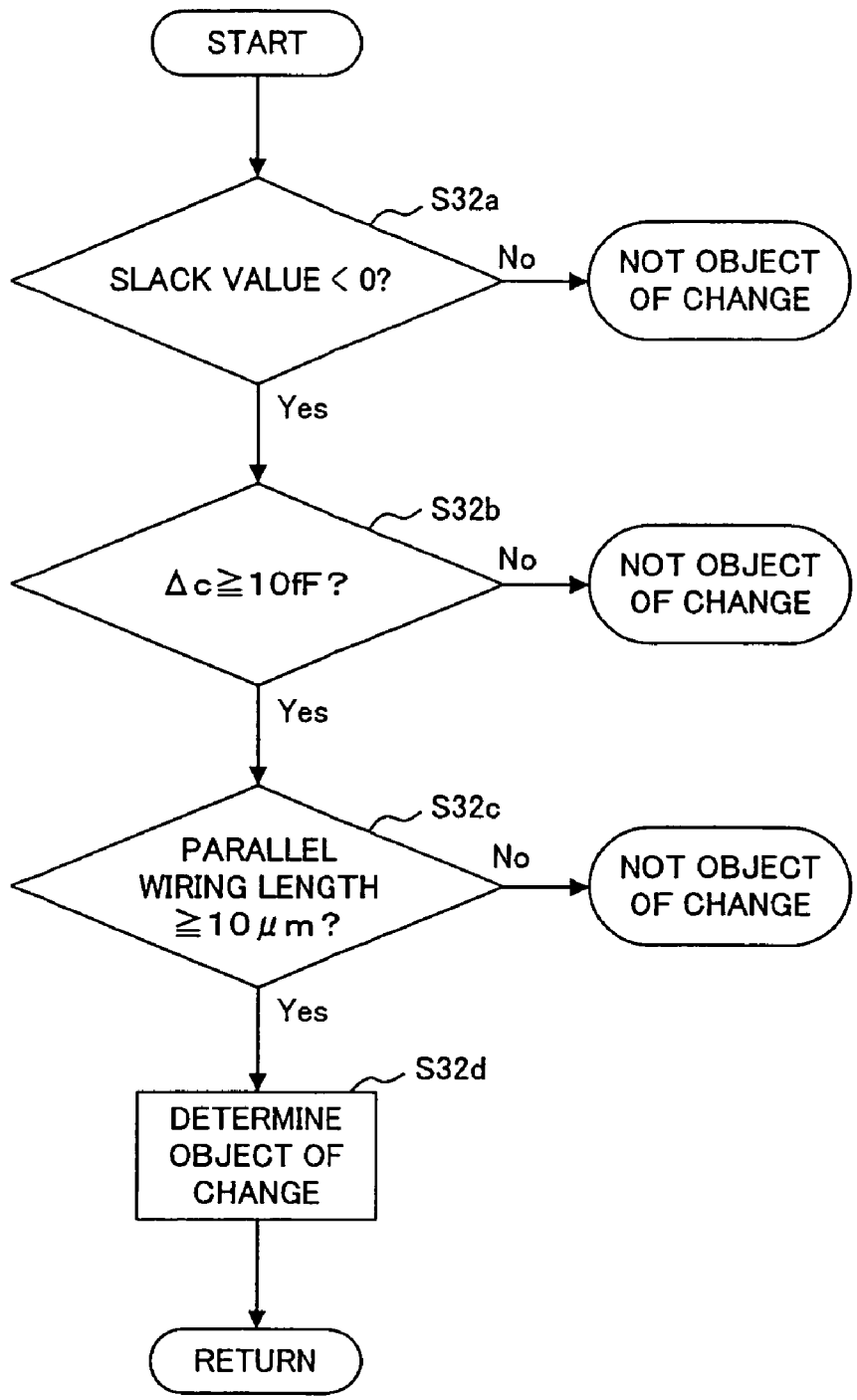
FIG. 9 is a flowchart for describing procedures of the wiring selection step in the delay improvement method serving as the first embodiment of the present invention.

FIG. 9 is a flowchart (step sS32a to S32d) showing procedures of the wiring selection step S24 (a step S32 shown in FIG. 7) in the delay improvement method of the embodiment. As shown in FIG. 9, in relation to the wiring selection step S24 (i.e., in step S32 in FIG. 7), the first wiring selection section 16-1 of the wiring selection section 16 selects, as wirings whose layouts are to be changed, wirings from the list L3, wherein slack values of the respective wirings are less than a predetermined value (less than 0 in the embodiment).

In a second wiring selection step S32b, the second wiring selection section 16-2 selects, as wirings whose layouts are to be changed, wirings from the wirings selected in the first wiring selection step, wherein the inter-wiring capacitance (Δc) of each of the wirings is greater than or equal to a predetermined value (e.g., 10 fF or more).

In the third wiring selection step S32c, the third wiring selection section 16-3 selects, as a wiring whose layout is to be changed, a wiring whose parallel wiring length is greater than or equal to a predetermined value (10 μm or more) from the wirings selected in the second wiring selection step S32b, whereby selection of a wiring whose layout is to be changed by the wiring selection section 16 is determined (step S32d).

In the embodiment, the wiring selected in the wiring selection step S24 is the wiring selected by all the first wiring selection section 16-1 through the third wiring selection sections 16-3. Therefore, in the present invention, no limitations are imposed on the sequence in which processing pertaining to the first wiring selection step S32a to that pertaining to the third wiring selection step S32c are to be performed.

As shown in FIG. 7, when the wiring has been selected by the wiring selection section 16 (step S32), the net/wiring list storage section 14 retains the list L4 of the selected wiring.

As described above, according to the delay improvement apparatus and method corresponding to the first embodiment of the present invention, the inter-wiring capacitance computation section 12 can compute inter-wiring capacitance high accuracy, by means of subtracting the wiring capacitance lower limit which corresponds to wiring capacitance acquired when the adjacent wirings are removed, computed by the wiring capacitance lower limit section 11 from the real inter-wiring capacitance. In the net selection step S23, the net selection section 15 selects a net on the basis of the inter-wiring capacitances computed by the inter-wiring capacitance computation section 12, thereby selecting a net which can improve a delay in the critical path without fail by means of changing a layout.

Moreover, in the net selection step S23, the net selection section 15 selects a net whose layout is to be changed, on the basis of the parallel wiring length extracted by the parallel wiring length extraction section 13. Therefore, a net which is likely to improve a delay in the wiring on the critical path by means of changing a layout can be specified efficiently.

Selection of a wiring by the wiring selection section 16 in the wiring selection step S24 can also yield the same advantage as that yielded as a result of selection of a net by the net selection section 15 in the net selection step S23.

Moreover, the net selection section 15 narrows down a net whose layout is to be changed. Next, the wiring selection section 16 specifies a wiring whose layout is to be changed, from the net selected by the net selection section 15. Hence, exposure of a wiring, which would in turn worsen the delay to a much greater extent, can be inhibited, and the layout of the entire LSI can be changed in a well-balanced manner to thereby improve the delay.

In the wiring layout change step S27, the wiring layout change section 18 changes the layouts of a predetermined number of wirings in accordance with the sequence ranked by the ranking section 17. Therefore, a delay in the critical path can be improved more efficiently than in a case where the layouts of selected wirings of interest are simply changed one by one.

[3] Second Embodiment

Figure 10:
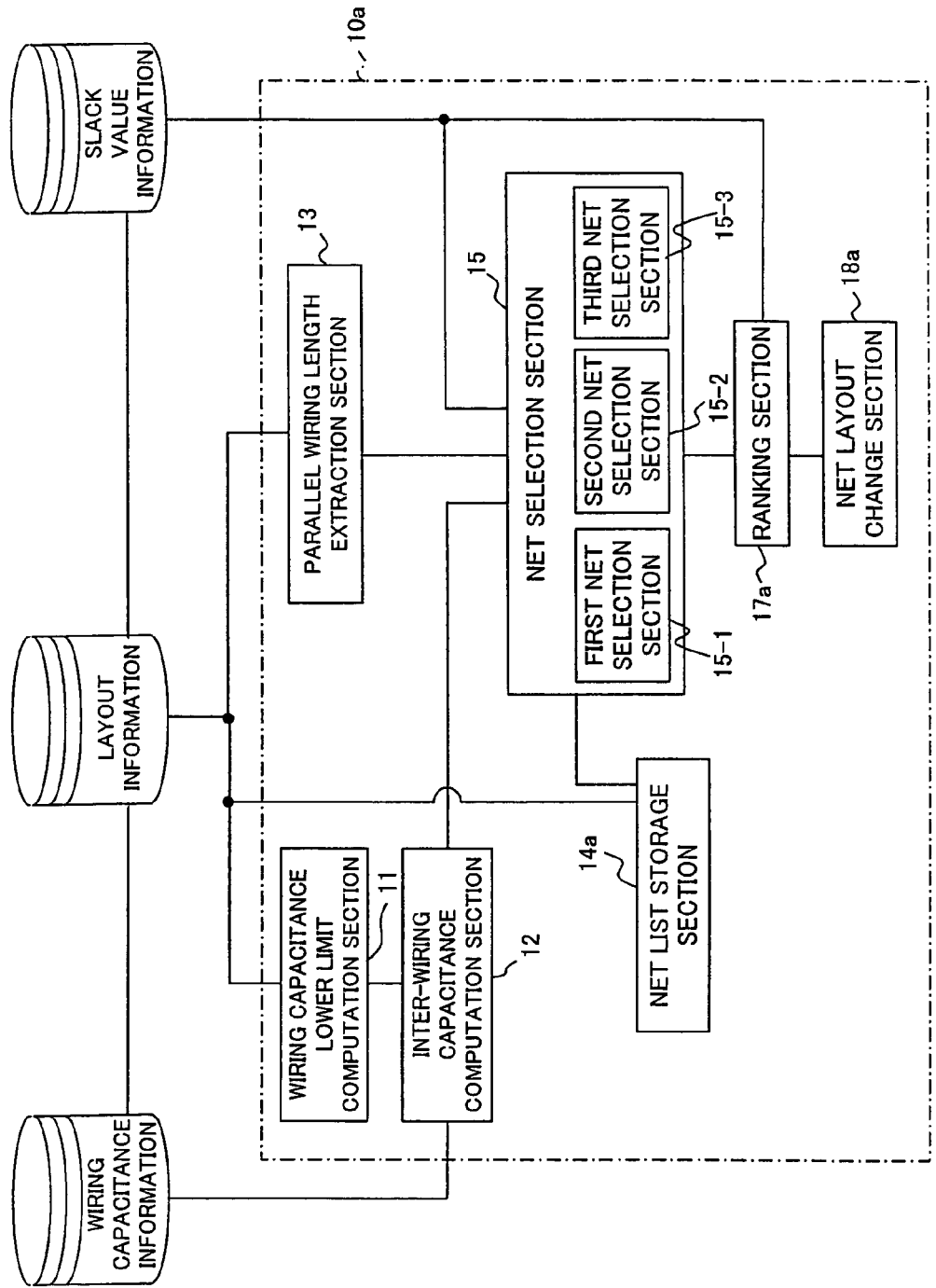
FIG. 10 is a block diagram showing the configuration of a delay improvement apparatus serving as a second embodiment of the present invention.

A delay improvement apparatus and method serving as a second embodiment of the present invention will now be described. FIG. 10 is a block diagram showing the configuration of a delay improvement apparatus serving as the second embodiment of the present invention. In FIG. 10, those reference numerals identical with the previously cited reference numerals designate identical sections or substantially identical sections, and hence detailed explanations are omitted.

A delay improvement apparatus 10a (see FIG. 10) of the embodiment selects a net whose layout is to be changed and changes the layout of the selected net. As shown in FIG. 10, in contrast with the delay improvement apparatus 10 (see FIG. 3) of the first embodiment, the delay improvement apparatus 10a is not provided with the wiring selection section 16.

A net list storage section 14a of the delay improvement apparatus 10a of the present embodiment is for storing selectable nets and retains a net list (see the net list L1 shown in FIG. 12) based on the layout information and the net list (see the net list L2 shown in FIG. 12) selected by the net selection section 15.

Moreover, when two or more nets are selected by the net selection section 15, the ranking section 17a of the delay improvement apparatus 10a of the embodiment ranks the nets on the basis of the slack values of the nets determined on the basis of the layout information. The smaller the slack value of a net, the higher the priority placed on changing the layouts of the wirings thereof.

A net layout change section 18a of the delay improvement apparatus 10a of the embodiment changes a layout by means of moving a predetermined number of nets in accordance with the sequence determined by the ranking section 17a such that inter-wiring capacitances among the wirings belonging to each of the nets are decreased; namely, such that the slack values of the nets are decreased so as to improve the delays in the nets.

In the delay improvement apparatus 10a shown in FIG. 10, the inter-wiring capacitance lower limit computation section 11, the inter-wiring capacitance computation section 12, the parallel wiring length extraction section 13, the net selection section 15, and a ranking section 17a function as the net selection device of the present invention.

Figure 11:
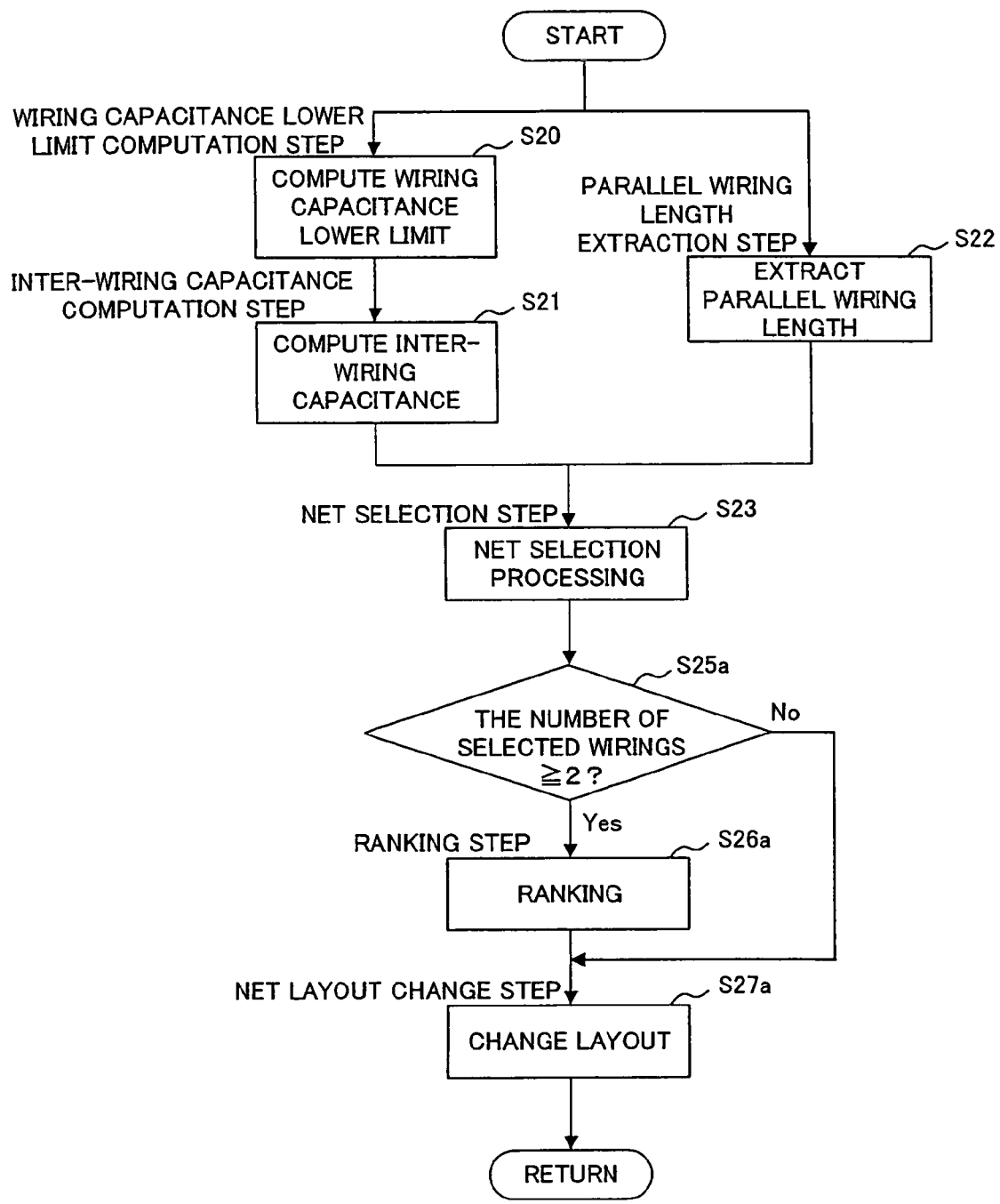
FIG. 11 is a flowchart for describing procedures of the delay improvement method serving as the second embodiment of the present invention.

The delay improvement method of the embodiment will now be described. FIG. 11 is a flowchart (steps S20 to S23 and S25a to S27a) showing procedures of the delay improvement method serving as the present embodiment. In FIG. 11, those reference numerals identical with the previously cited reference numerals designate identical sections or substantially identical sections, and hence detailed explanations are omitted.

As shown in FIG. 11, under the delay improvement method of the embodiment, when the net selection section 15 has selected two or more nets as nets whose layouts are to be changed in the net selection step S23 (when YES is selected in step S25a), the ranking section 17a ranks, in the ranking step S26a, the plurality of nets selected by the net selection section 15 on the basis of the slack values. In the meantime, if less than two nets are selected in the net selection step S23 (when NO is selected in step S25), the ranking step S26a is skipped.

In the net layout change step S27a, the net layout change section 18a changes the layout(s) of the net(s) so as to reduce the inter-wiring capacitances of the wirings belonging to the net(s) selected in the net selection step S23 (to improve the delay in the net).

Under the delay improvement method of the embodiment shown in FIG. 11, the inter-wiring capacitance lower limit computation step S20, the inter-wiring capacitance computation step S21, the parallel wiring length extraction step S22, the net selection step S23, and the ranking step S26a function as the net selection method of the present invention.

Figure 12:
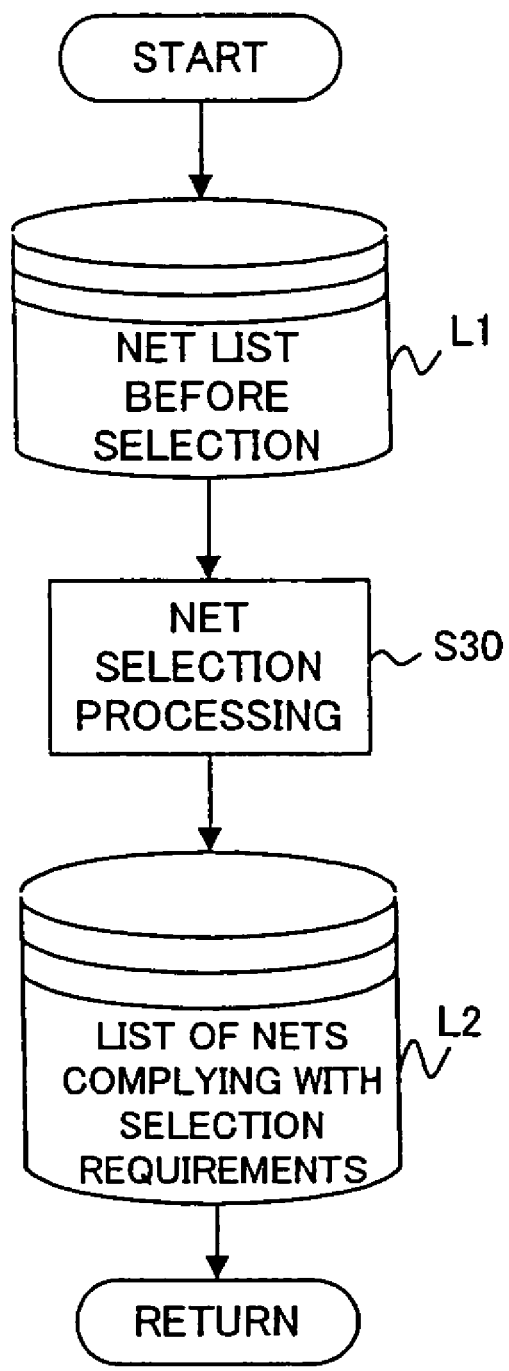
FIG. 12 is a flowchart for describing procedures of a net selection step in the delay improvement method serving as the second embodiment of the present invention.

FIG. 12 is a flowchart (step S30) for describing procedures of the net selection step S23 in the delay improvement method of the embodiment. The net selection step S23 in the delay improvement method of the embodiment operates in the same manner as in the case of the first embodiment described by reference to FIG. 8 (steps S30a to S30c). At this time, as shown in FIG. 12, the net selection section 15 selects nets whose layouts are to be changed from the net/wiring list L1 based on the layout information retained in the net list storage section 14a; that is, all the net lists (step S30). The list L2 of the thus-selected nets (the nets complying with the selection requirements of the net selection section 15) is retained in the net list storage section 14a.

As mentioned above, according to the delay improvement apparatus and method serving as the second embodiment of the present invention, the delay in the critical path can be improved without fail by changing layout, an done or more nets whose layouts are to be changed with priority can be specified, as in the case of the first embodiment.

In the net selection step S23, the net selection section 15 selects one or more nets whose layouts are to be changed, on the basis of the parallel wiring length extracted by the parallel wiring length extraction section. One or more nets which are likely to improve a delay in the critical path by means of changing layout and whose layouts are to be changed with priority can be specified efficiently without fail.

In the net layout change step S27a, the layout change section 18a changes the layouts of the predetermined number of nets in accordance with the sequence ranked by the ranking section 17a. Therefore, a delay in the critical path can be improved more efficiently than in a case where the layouts of selected nets are simply changed on an individual basis.

[4] Third Embodiment

Figure 13:
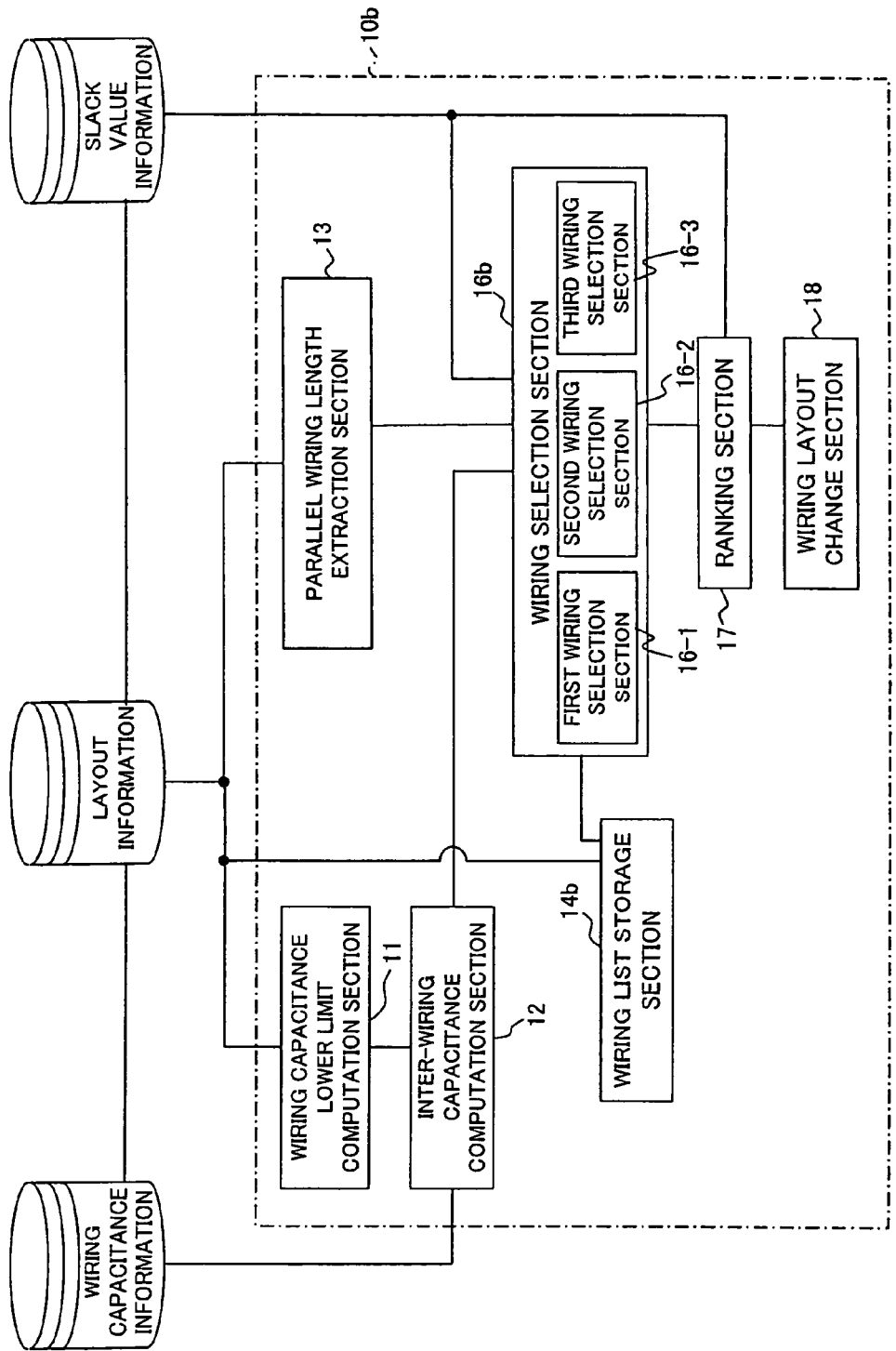
FIG. 13 is a block diagram showing the configuration of a delay improvement apparatus serving as a third embodiment of the present invention.

A delay improvement apparatus and method serving as a third embodiment of the present invention will now be described. FIG. 13 is a block diagram showing the configuration of a delay improvement apparatus serving as the embodiment of the present invention. In FIG. 13, those reference numerals identical with the previously cited reference numerals designate identical sections or substantially identical sections, and hence detailed explanations are omitted.

As shown in FIG. 13, in contrast with the delay improvement apparatus 10 of the first embodiment (see FIG. 3), a delay improvement apparatus 10b of the embodiment is not provided with the net selection section 15. In contrast with the delay improvement apparatus 10 of the first embodiment, a net whose layout is to be changed is not selected, nor is a wiring whose layout is to be changed selected from the thus-selected net. A wiring whose layout is to be changed is selected directly from all wirings, and the lay out of the thus-selected wiring is changed.

A wiring selection section 16b of the delay improvement apparatus 10b of the embodiment selects a wiring whose layout is to be changed, from the list of all wirings based on the layout information retained in a wiring list storage section 14b to be described later. The first wiring selection section 16-1, the second wiring selection section 16-2, and the third wiring selection section 16-3, all belonging to the wiring selection section 16b, are analogous to those of the first embodiment, and their detailed descriptions are omitted.

The wiring list storage section 14b of the delay improvement apparatus 10b of the embodiment stores selectable wirings and retains a list of all wirings based on the layout information (see a wiring list L10 shown in FIG. 15) and a wiring list (see a wiring list L11 shown in FIG. 15) selected by the wiring selection section 16b.

In the delay improvement apparatus 10b shown in FIG. 13, the inter-wiring capacitance lower limit computation section 11, the inter-wiring capacitance computation section 12, the parallel wiring length extraction section 13, the wiring selection section 16b, and the ranking section 17 function as the wiring selection apparatus of the present invention.

Figure 14:
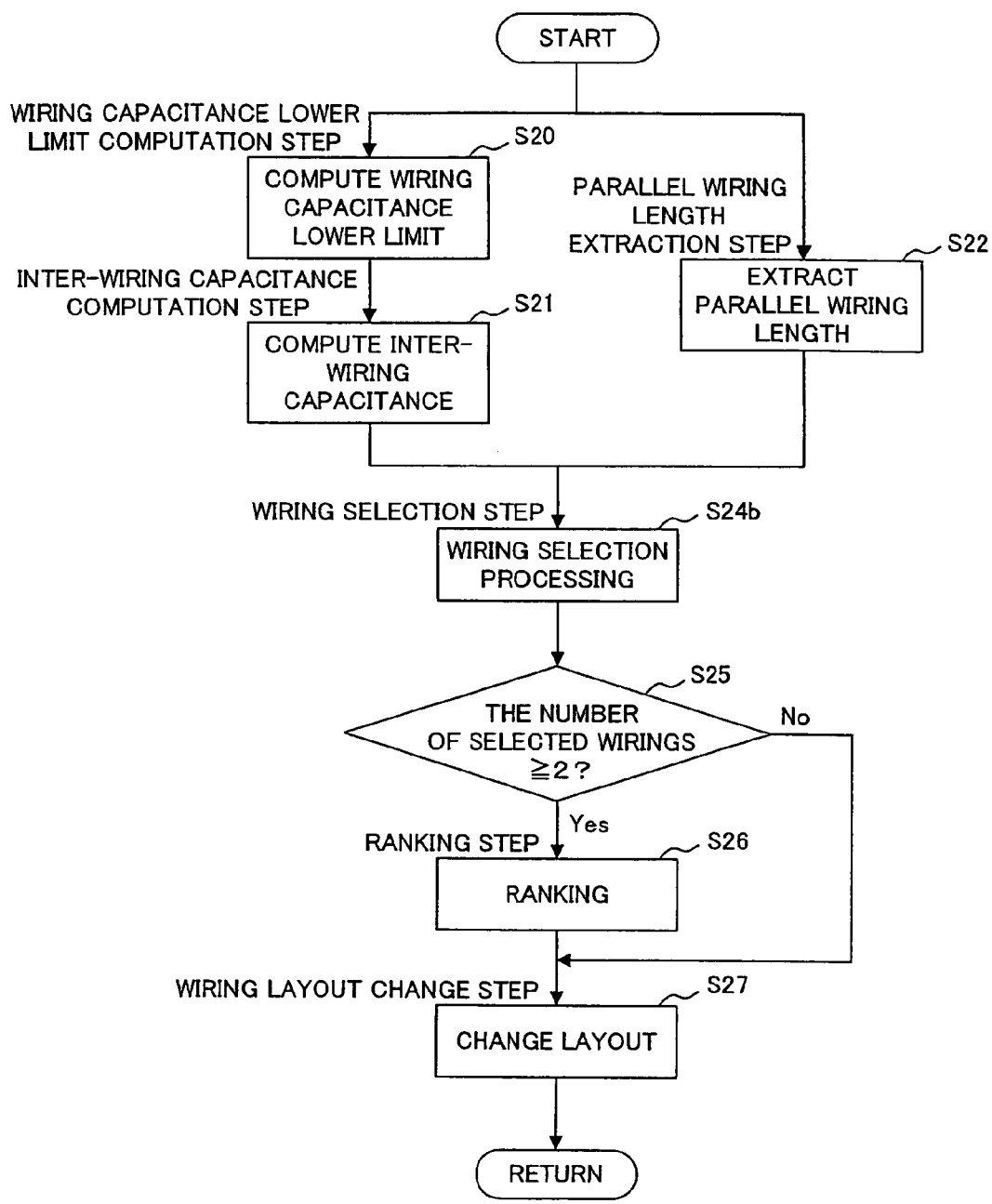
FIG. 14 is a flowchart for describing procedures of the delay improvement method serving as the third embodiment of the present invention.

The delay improvement method of the embodiment will now be described. FIG. 14 is a flowchart (steps S20 to S22, S24b, and S25 to S27) showing procedures of the delay improvement method serving as the third embodiment. In FIG. 14, those reference numerals identical with the previously cited reference numerals designate identical sections or substantially-identical sections, and hence detailed explanations are omitted.

As shown in FIG. 14, under the delay improvement method of the embodiment, the wiring selection section 16b selects a wiring whose layout is to be changed from all wirings, on the basis of the slack value determined from the layout information, the inter-wiring capacitance computed in the inter-wiring capacitance computation step S21, and the parallel wiring length extracted in the parallel wiring length extraction step S22.

Under the delay improvement method of the embodiment shown in FIG. 14, the inter-wiring capacitance lower limit computation step S20, the inter-wiring capacitance computation step S21, the parallel wiring length extraction step S22, the wiring selection step S24b, and the ranking step S26 function as the wiring selection method of the present invention.

Figure 15:
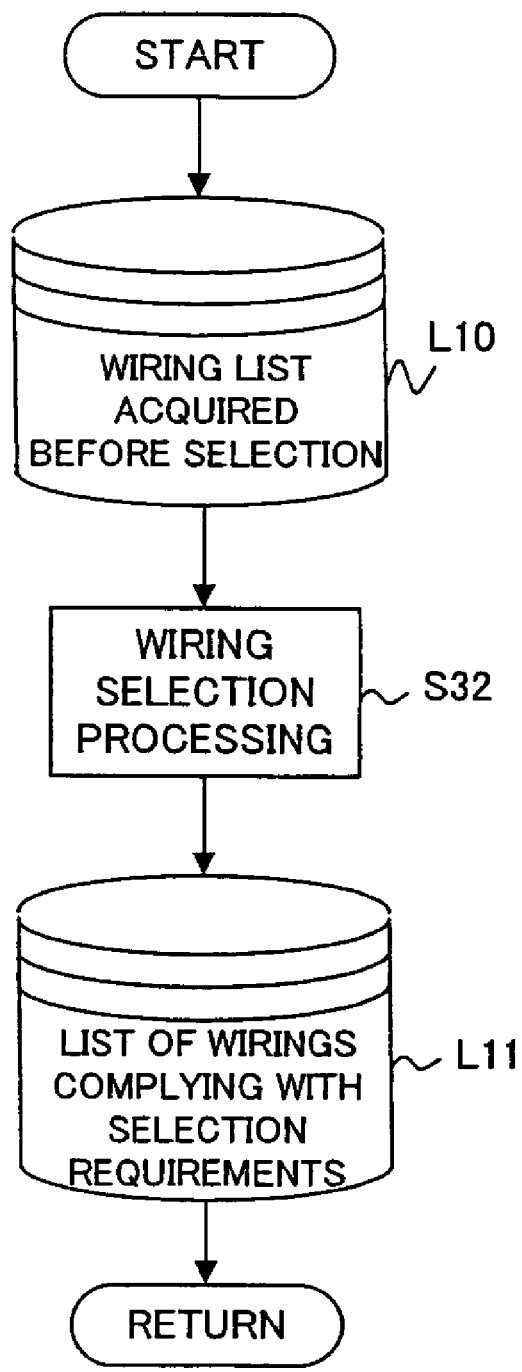
FIG. 15 is a flow chart for describing procedures of a wiring selection step and those of a wiring selection step in the delay improvement method serving as the third embodiment of the present invention.

FIG. 15 is a flowchart (step S32) for describing procedures of the wiring selection step S24b in the delay improvement method of the embodiment. The wiring selection step S24b in the delay improvement method of the embodiment operates in the same manner as in the case of the first embodiment described by reference by FIG. 9 (steps S32a to S32c). At this time, as shown in FIG. 15, the wiring selection section 16b selects wirings whose layouts are to be changed from the wiring list L10 which is acquired before selection and based on the layout information retained in the net list storage section 14b; that is, the list of all wirings (step S32). The list L11 of the thus-selected wiring (the wiring complying with the selection requirements of the wiring selection section 16b) is retained in the wiring list storage section 14b.

As mentioned above, according to the delay improvement apparatus and method employed as the third embodiment of the present invention, the delay in the critical path can be improved without fail by changing a layout, and a wiring whose layout is to be changed with priority can be specified, as in the case of the first embodiment.

In the wiring selection step S24b, the wiring selection section 16b selects a wiring whose layout is to be changed, on the basis of the parallel wiring length extracted by the parallel wiring length extraction section 16b. A wiring which is likely to improve a delay in the critical path by means of changing a layout and whose layout is to be changed with priority can be specified efficiently without fail.

In the wiring layout change step S27, the layout change section 18 changes the layout of the predetermined number of wirings in accordance with the sequence ranked by the ranking section 17. Therefore, a delay in the critical path can be improved more efficiently than in a case where the layouts of selected wirings are simply changed on an individual basis.

[5] Modifications of the Present Invention

The present invention is not limited to the previously-described embodiments and can be carried out in various manners while being modified in various forms within the scope of the gist of the invention.

[5-1] First Modification

For instance, in the embodiment, the wiring capacitance lower limit computation section 11 is configured to compute the wiring capacitance of a target wiring as the wiring capacitance lower limit on condition that all other wirings adjacent to the target wiring have been removed. The present invention is not limited to this configuration. When limitations are imposed on the layout, the wiring capacitance lower limit computation section 11 computes the capacitance of the target wiring as the wiring capacitance lower limit according to design data, such as layout information, on condition that other wirings adjacent to the target wiring are spaced away from each other by a predetermined distance.

Figure 4:
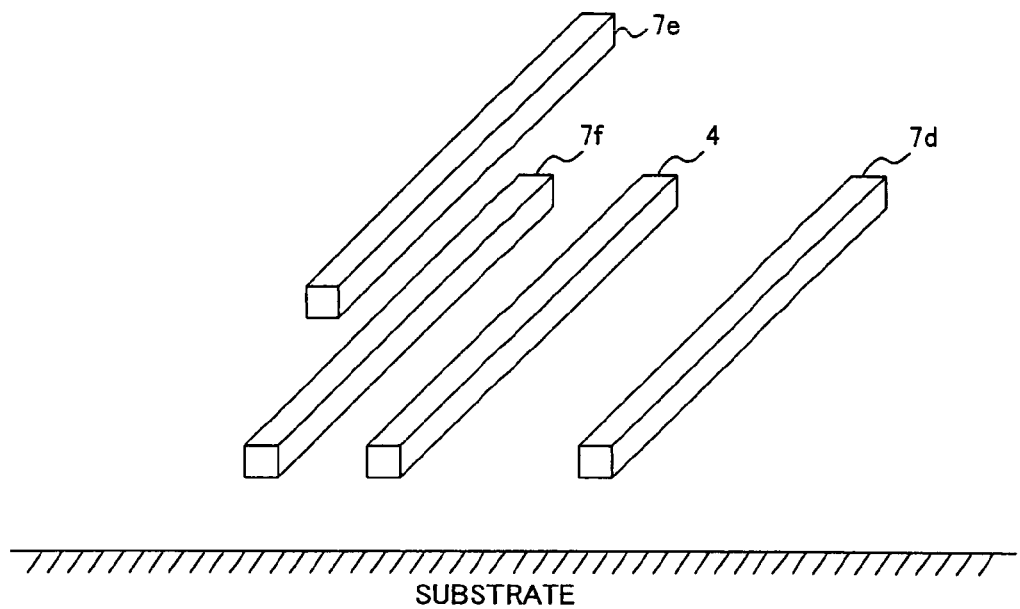
FIG. 4 is a diagrammatic view showing a target wiring wired on a substrate.
Figure 5:
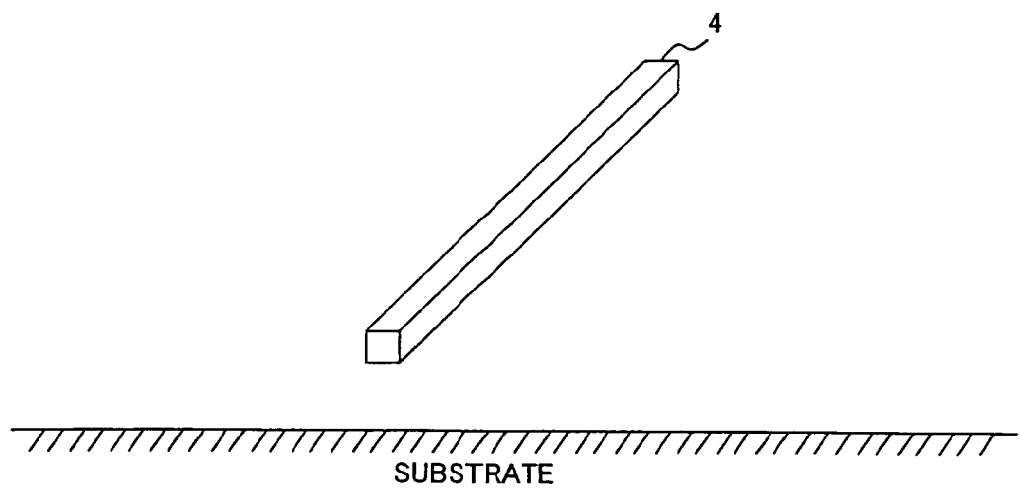
FIG. 5 is a diagrammatic view for describing a method for computing a wiring capacitance lower limit to be performed by a wiring capacitance lower limit computing section in the delay improvement apparatus serving as the first embodiment of the present invention.
Figure 16:
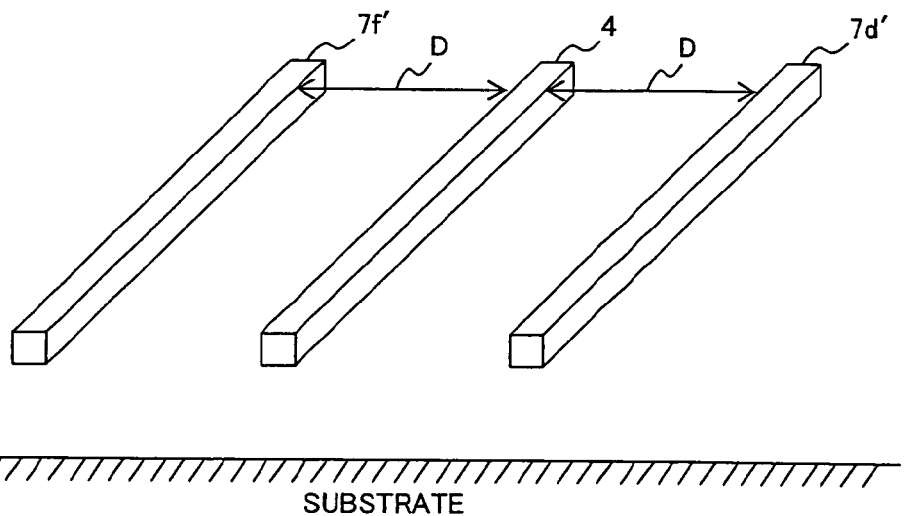
FIG. 16 is a diagrammatic view for describing a method for computing a wiring capacitance lower limit to be performed by a wiring capacitance lower limit computing section in a delay improvement apparatus serving as a modification of the present invention.

As shown in FIG. 4, in reality, even when wirings 7d to 7f are adjacent to the neighborhood of the target wiring 4 provided on the substrate, the wiring capacitance lower limit computation section 11 may compute the wiring capacitance, which would be acquired when, as shown in FIG. 16, virtual wirings 7d' and 7f' are provided around and spaced from the target wiring 4 by a predetermined distance D, as the wiring capacitance lower limit of the target wiring 4.

[5-2] Second Modification

The previously-described embodiments are based on the premise that selection of a net by the net selection section 15 is effected only when the net has been selected by all of the first through third net selection sections 15-1 to 15-3 (see steps S30a to S30c shown in FIG. 8). However, the present invention is not limited to these embodiments. The only requirement is that the net selection section 15 select a net on the basis of the inter-wiring capacitance computed by the inter-wiring capacitance computation section 12, the parallel wiring length extracted by the parallel wiring length extraction section 13, and the slack value of the net. Therefore, when a net whose layout is to be changed is selected, no limitations are imposed on the selection requirements which are changed in various manners by means of a combination of the net selection steps 15-1 to 15-3, so long as all the first net selection section 15-1 to the third net selection section 15-3 are taken into consideration.

Figure 17:
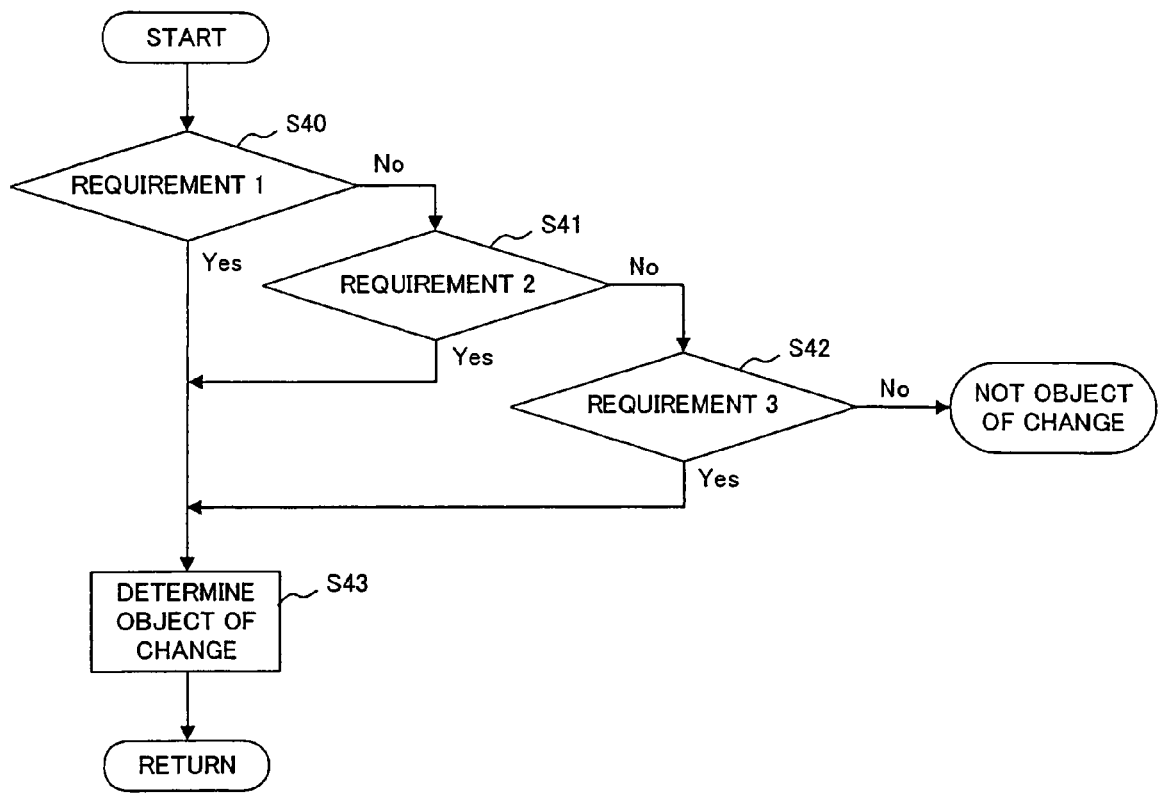
FIG. 17 is a flowchart for describing selection requirements of the net selection section and those of the wiring selection section in a delay improvement apparatus serving as a modification of the present invention.
Figure 18:
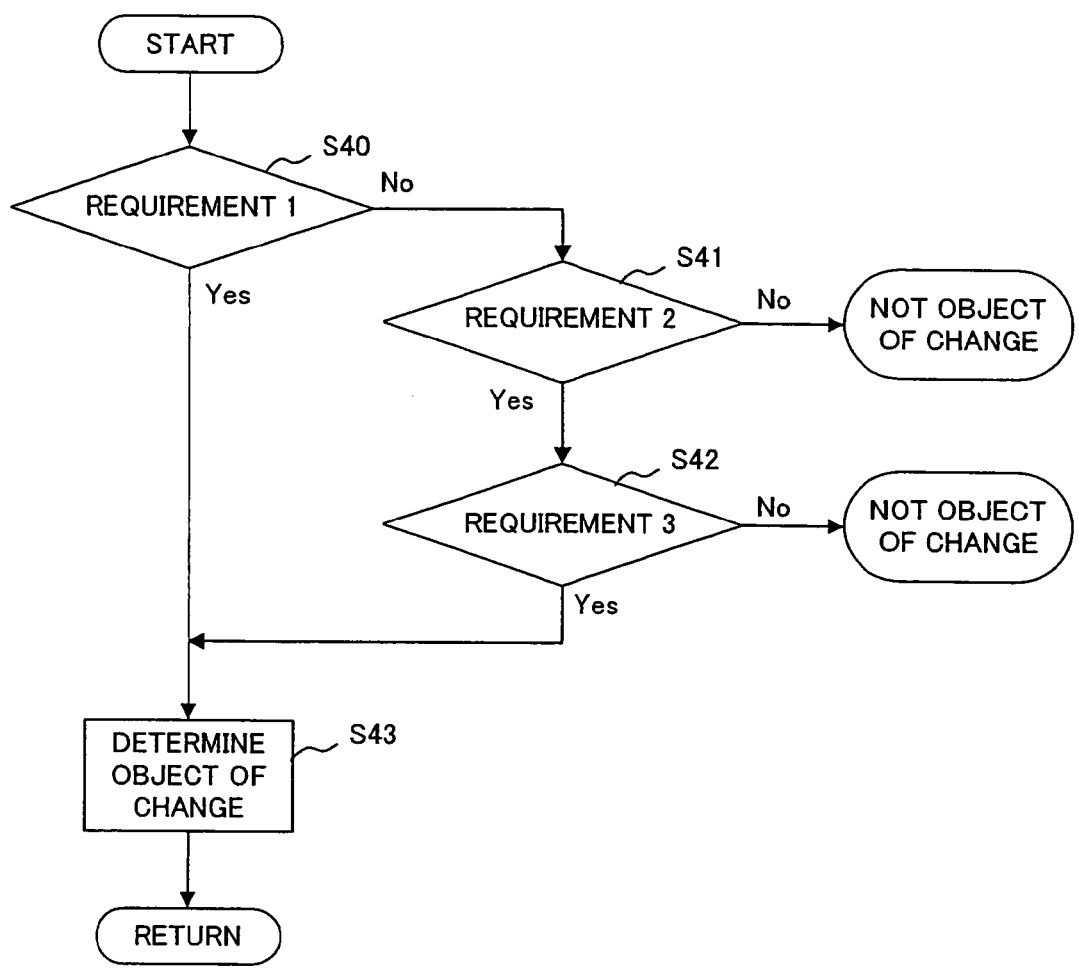
FIG. 18 is a flowchart for describing selection requirements of the net selection section and those of the wiring selection section in a delay improvement apparatus serving as a modification of the present invention.
Figure 19:
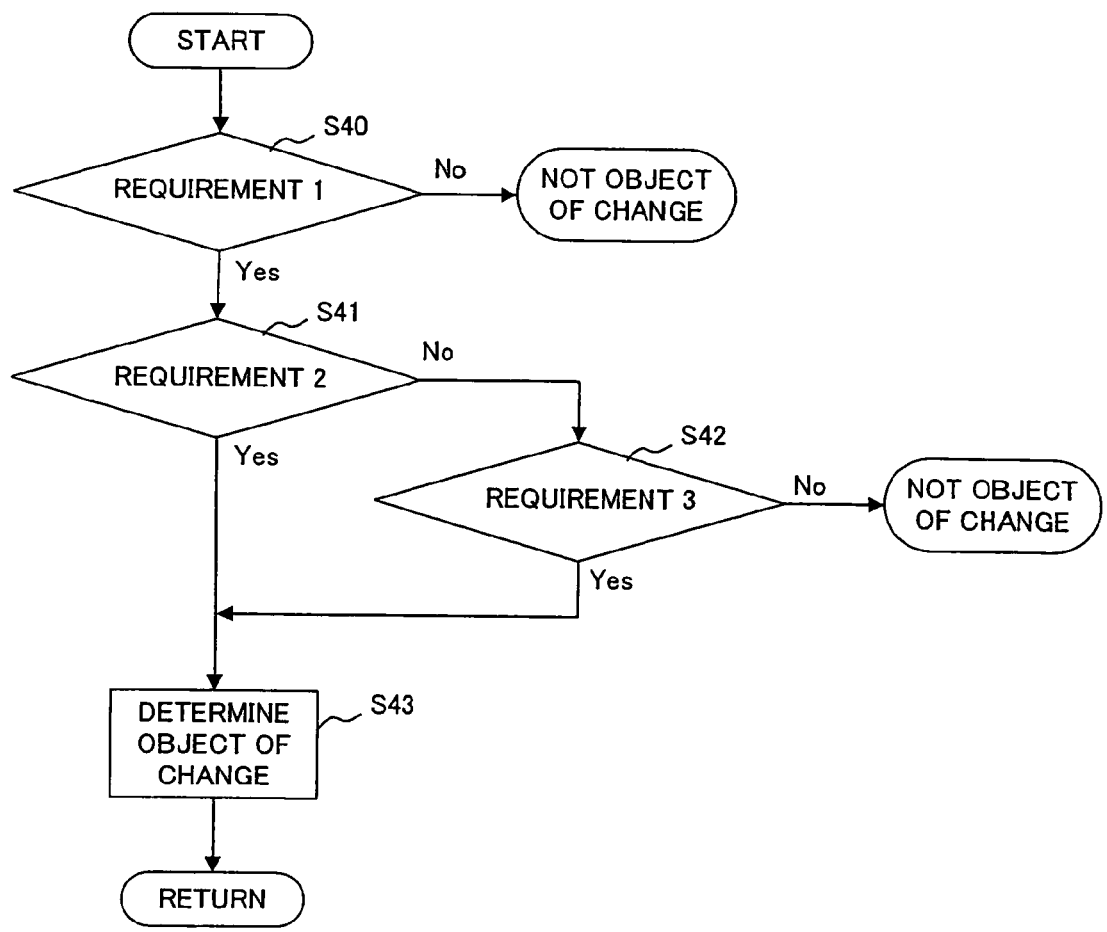
FIG. 19 is a flowchart for describing selection requirements of the net selection section and those of the wiring selection section in a delay improvement apparatus serving as a modification of the present invention.

As shown in, e.g., FIGS. 17 to 19 (steps S40 to S43), the selection requirements of the net selection sections 15-1 to 15-3 (steps S30a to S30c shown in FIG. 8) may be assigned to the first to third requirements 1 to 3 of steps S40 to S42, as appropriate, whereby the net selection section 15 may select a net whose layout is to be changed (step S43).

Likewise, even in relation to selection of wirings by the wiring selection sections 16, 16b, the only requirement is that the wiring selection sections 16, 16b select wirings on the basis of the inter-wiring capacitance computed by the inter-wiring capacitance computation section 12, the parallel wiring length extracted by the parallel wiring length extraction section 13, and the slack values of the wirings. For instance, as shown in FIGS. 17 through 19 (steps S40 to S43), the selection requirements of the first to third wiring selection sections 16-1 to 16-3 (steps S32a to S32c shown in FIG. 9) may be assigned to the requirements 1 to 3 of steps S40 to S42, as appropriate, whereby the wiring selection sections 16, 16b may select a wiring whose layout is to be changed (step S43).

[5-3] Third Modification

Figure 20:
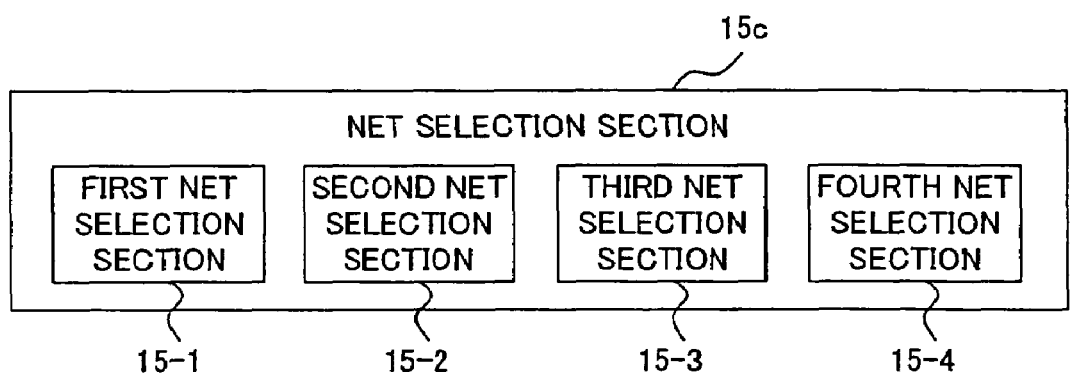
FIG. 20 is a block diagram showing the configuration of the net selection section of the improvement delay apparatus serving as a modification of the present invention.

The previously-described embodiments are configured such that the net selection section 15 is provided with the first net selection section 15-1 to the third net selection sections 15-3. However, the present invention is not limited to the embodiments. As shown in FIG. 20, in addition to having the first net selection section 15-1 to the third net selection section 15-3, the net selection section 15c may be configured to further have a fourth net selection section 15-4. The net selection section 15c shown in FIG. 20 may be applied to any of the first through third embodiments.

At least one of selection requirements (a) to (e) provided below is considered to be a requirement for the fourth net selection section 15-4 to select a net.

Requirement (a): A total length of wirings belonging to a net is equal to or greater/smaller than a predetermined value.

Requirement (b): A total capacitance of wirings belonging to a net is equal to or greater/smaller than a predetermined value.

Requirement (c): A total of wiring capacitance lower limits of wirings belonging to a net, which is computed by the wiring capacitance lower limit section 11, is equal to or greater/smaller than a predetermined value.

Requirement (d): A total of lengths of parallel wirings belonging to a net, which is computed by the parallel wiring length extraction section 13, is equal to or greater/smaller than a predetermined value.

Requirement (e): A total of resistance values of wirings belonging to a net is equal to or greater/smaller than a predetermined value.

The net selection method (requirement) for the net selection section 15c having the fourth net selection section 15-4 should merely use all of the first net selection section 15-1 to the fourth net selection section 15-4. No limitations are imposed on the selection requirements which can be modified in various manners by a combination of the net selection sections 15-1 to 15-4.

As mentioned above, in the previously-described embodiment, the net whose layout is to be changed with priority can be selected without fail. For instance, a net complying with the limitations on the layout can be selected appropriately.

Figure 21:
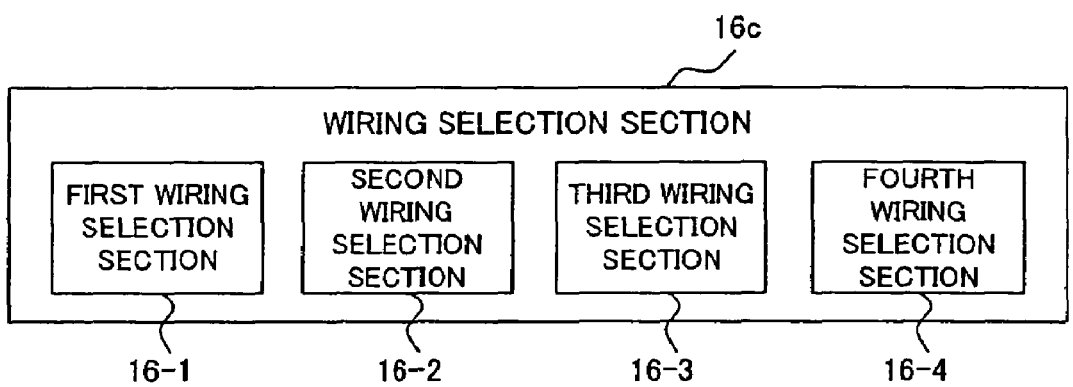
FIG. 21 is a block diagram showing the configuration of the wiring selection section of the improvement delay apparatus serving as a modification of the present invention.

Moreover, in the present invention, the wiring selection sections 16, 16b can also be constituted in the same manner as is the net selection section 15c. Specifically, as shown in FIG. 21, in addition to having the first wiring selection section 16-1 to the third wiring selection section 16-3, the wiring selection section 16c may be configured to further have a fourth net selection section 16-4. The wiring selection section 16c shown in FIG. 21 may be applied to any of the first through third embodiments.

At least one of selection requirements (i) to (iv) provided below is considered to be a requirement for the fourth wiring selection section 16-4 to select a net.

Requirement (i): A total length of wirings is equal to or greater/smaller than a predetermined value.

Requirement (ii): A total capacitance of wirings is equal to or greater/smaller than a predetermined value.

Requirement (iii): Wiring capacitance lower limits of the wirings computed by the wiring capacitance lower limit section 11 are equal to or greater/smaller than a predetermined value.

Requirement (iv): Wirings are provided on a specific layer of a substrate.

Requirement (v): Width of the wirings fall within a predetermined range.

Requirement (vi): Resistance values of the wirings are equal to or greater/lower than a predetermined value.

The wiring selection method (requirement) for the wiring selection section 16c having the fourth wiring selection section 16-4 should merely use all of the first wiring selection section 16-1 to the fourth wiring selection section 16-4. No limitations are imposed on the selection requirements, which can be modified in various manners by a combination of the wiring selection sections 16-1 to 16-4.

As a result, in contrast with the previously-described embodiments, a wiring whose layout is to be changed with priority can be selected more reliably. For instance, a wiring complying with limitations on a layout can be selected appropriately.

[5-4] Fourth Modification

In the present invention, the net selection requirements for the net first net selection section 15-1 to the third net selection section 15-3 of the net selection section 15 are not limited to the previously-described embodiments (i.e., steps S30a to S30c shown in FIG. 8). For instance, at least one of the requirements (a) to (e) may be added to the respective selection requirements of the first net selection section 15-1 to the third net selection section 15-3. For instance, the total of inter-wiring capacitances (Δc_total) computed by the inter-wiring capacitance computation section 12, which is the selection requirement of the second net selection section 15-2, may be multiplied by a total of resistance values of wirings belonging to the net [i.e., the requirement (e)], to thus determine a value. On condition that the thus-determined value is taken as an upper limit of an increase in a delay due to the inter-wiring capacitance, the fact that the value is equal to or greater/smaller than a predetermined value may be employed as the selection requirement of the second net selection section 15-2.

The wiring selection requirements for the first wiring selection section 16-1 to the third wiring selection section 16-3 of the wiring selection sections 16, 16b are not limited to the previously-described embodiment (i.e., steps S32a to S32c shown in FIG. 9). For instance, at least one of the requirements (i) to (iv) may be added to the selection requirements for the first wiring selection section 16-1 to the third wiring selection section 16-3.

[6] Others

The function of the wiring capacitance lower limit computation section 11; the inter-wiring capacitance computation section 12; the parallel wiring length extraction section 13; the net/wiring list storage section 14; the net list storage section 14a, the wiring list storage section 14b; the net selection sections 15, and 15c; the wiring selection sections 16, 16b, and 16c; the ranking sections 17, 17a; the wiring layout change section 18, and the net layout change section 18a are realized by execution of predetermined application programs (a net/wiring selection program or a delay improvement program) of a computer (including a CPU, a data processor, and respective terminals).

The programs are provided while being recorded in a computer-readable recording medium; e.g., a flexible disk, a CD-ROM, a CD-R, a CD-RW, or a DVD. In this case, the computer reads the net/wiring selection program or the delay improvement program from the recording medium and transfers and stores the thus-read program into an internal storage device or an external storage device. The program may be recorded in a storage device (recording medium); e.g., a magnetic disk, an optical disk, a magneto-optical disk, or the like, and may be provided from the storage device to a computer by way of a communications line.

Here, the computer is a concept including hardware and an OS (Operating System) and signifies hardware which operates under control of the OS. When the OS is not required and when hardware is activated solely with an application program, the hardware itself corresponds to a computer. The hardware is provided with, at least, a microprocessor such as a CPU, and a section for reading the computer program recorded on the recording medium. The application program serving as the net/wiring selection program and the application program serving as the delay improvement program include program codes for causing a computer such as that mentioned previously to act as the wiring capacitance lower limit computation section 11, the inter-wiring capacitance computation section 12, the parallel wiring length extraction section 13, the net/wiring list storage section 14, the net list storage section 14a, the wiring list storage section 14b, the net selection sections 15, 15c, the wiring selection sections 16, 16b, 16c, the ranking sections 17, 17a, the wiring layout change section 18, and the net layout change section 18a. Portions of the functions may be implemented by the OS rather than by the application programs.

Moreover, in addition to the previously-described flexible disk, the CD-ROM, the CD-R, the CD-RW, the DVD, the magnetic disk, the optical disk, the magneto-optical disk, or the like, various computer-readable mediums, such as an IC card, a ROM card, a magnetic tape, a punch card, an internal storage device (memory such as RAM or ROM) of the computer, an external storage device, a print having codes such as bar codes printed thereon, or the like, can also be utilized.

What is claimed is:

1. A computer-readable medium encoded with a computer program for a net selection method for selecting, from among nets wired on the basis of layout information, at least one net whose layout is to be preferentially changed in order to improve a delay, the program when executed by a computer causes the computer to perform a method comprising:
   a wiring capacitance lower limit computation step of computing wiring capacitance lower limits of respective wirings belonging to said nets, on the basis of said layout information;
   an inter-wiring capacitance computation step of computing, as an inter-wiring capacitance, a difference between a real wiring capacitance and said wiring capacitance lower limit computed in said wiring capacitance lower limit computation step;
   a parallel wiring length extraction step of extracting a parallel wiring length existing between adjacent wirings belonging to said nets, on the basis of said layout information;
   a first net selection step of selecting a first net whose slack value is less than a predetermined value, as said at least one net;
   a second net selection step of selecting a second net as said at least one net, wherein a total of inter-wiring capacitances of all wirings belonging to each of said nets computed in said inter-wiring computation step is greater than or equal to a predetermined value; and
   a third net selection step of selecting, as said at least one net, a third net having wirings whose parallel length extracted in said parallel wiring length extraction step is greater than or equal to a predetermined value.

2. A net selection apparatus for selecting, from among nets wired on the basis of layout information, at least one net whose layout is to be preferentially changed in order to improve a delay, said apparatus comprising:
   a wiring capacitance lower limit computation section computing wiring capacitance lower limits of respective wirings, on the basis of said layout information;
   an inter-wiring capacitance computation section computing, as an inter-wiring capacitance, a difference between a real wiring capacitance and said wiring capacitance lower limit computed by said wiring capacitance lower limit computation section;
   a parallel wiring length extraction section extracting a parallel wiring length existing between adjacent wirings belonging to said nets, on the basis of said layout information;
   a first net selection section selecting a first net whose slack value is less than a predetermined value, as said at least one net;
   a second net selection section selecting a second net as said at least one net, wherein a total of inter-wiring capacitances of all wirings belonging to each of said nets computed by said inter-wiring computation section is greater than or equal to a predetermined value; and
   a third net selection section selecting, as said at least one net, a third net having wirings whose parallel length extracted by said parallel wiring length extraction section is greater than or equal to a predetermined value.

3. A net selection program stored in a computer readable device, said net selection program, when executed by a computer, enabling said computer to perform a function of selecting, from among nets wired on the basis of layout information, at least one net whose layout is to be preferentially changed in order to improve a delay, said net selection program enabling said computer to implement:
   a wiring capacitance lower limit computation section computing wiring capacitance lower limits of respective wirings belonging to said nets, on the basis of said layout information;
   an inter-wiring capacitance computation section computing, as an inter-wiring capacitance, a difference between a real wiring capacitance and said wiring capacitance lower limit computed by said wiring capacitance lower limit computation section;
   a parallel wiring length extraction section extracting a parallel wiring length existing between adjacent wirings belonging to said nets, on the basis of said layout information;
   a first net selection section selecting a net whose slack value is less than a predetermined value, as said at least one net;
   a second net selection section selecting a second net as said at least one net, wherein a total of inter-wiring capacitances of all wirings belonging to each of said nets computed by said inter-wiring computation section is greater than or equal to a predetermined value; and
   a third net selection section selecting, as said at least one net, a third net having wirings whose parallel length extracted by said parallel wiring length extraction section is greater than or equal to a predetermined value.

4. A delay improvement program stored in a computer readable device, said delay improvement program, when executed by a computer, enabling said computer to perform a function of changing a layout by means of selecting, from among wirings wired on the basis of layout information, a wiring whose layout is to be preferentially changed in order to improve a delay, said delay improvement program enabling said computer to implement:
   a wiring capacitance lower limit computation section computing wiring capacitance lower limits of respective wirings on the basis of said layout information;
   an inter-wiring capacitance computation section computing, as an inter-wiring capacitance, a difference between a real wiring capacitance and said wiring capacitance lower limit computed by said wiring capacitance lower limit computation section;
   a parallel wiring length extraction section extracting a parallel wiring length existing between adjacent wirings of said respective wirings, on the basis of said layout information;
   a net selection section selecting a net whose layout is to be changed, on the basis of a total of said inter-wiring capacitances of all wirings belonging to said net which have been computed by said inter-wiring capacitance computation section, said parallel wiring lengths of said respective wirings belonging to said net extracted by said parallel wiring extraction section, and a slack value of said net;
   a wiring selection section selecting, from among wirings belonging to said net selected by said net selection section, a wiring whose layout is to be changed on the basis of said inter-wiring capacitance, said parallel wiring length, and a slack value of a wiring; and
   a layout change section changing a layout of said wiring selected by said wiring selection section.

* * * * *

UNITED STATES PATENT AND TRADEMARK OFFICE
CERTIFICATE OF CORRECTION

| | | |
|---|---|---|
| PATENT NO. | : 7,600,205 B2 | Page 1 of 1 |
| APPLICATION NO. | : 11/637728 | |
| DATED | : October 6, 2009 | |
| INVENTOR(S) | : Hiroshi Ikeda | |

It is certified that error appears in the above-identified patent and that said Letters Patent is hereby corrected as shown below:

Column 18, Line 18, change "a net" to --a first net--.

Signed and Sealed this

Fifth Day of January, 2010

David J. Kappos
*Director of the United States Patent and Trademark Office*